(12) United States Patent
Okishima

(10) Patent No.: US 9,754,915 B2
(45) Date of Patent: Sep. 5, 2017

(54) SEMICONDUCTOR DEVICE MANUFACTURING METHOD

(71) Applicant: RENESAS ELECTRONICS CORPORATION, Tokyo (JP)

(72) Inventor: Kazuhiko Okishima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 6 days.

(21) Appl. No.: 15/060,415

(22) Filed: Mar. 3, 2016

(65) Prior Publication Data

US 2016/0293569 A1   Oct. 6, 2016

(30) Foreign Application Priority Data

Mar. 30, 2015   (JP) ................. 2015-069375

(51) Int. Cl.
*H01L 23/00* (2006.01)
*H01L 23/495* (2006.01)

(52) U.S. Cl.
CPC .......... *H01L 24/85* (2013.01); *H01L 23/4952* (2013.01); *H01L 23/49562* (2013.01); *H01L 23/49568* (2013.01); *H01L 2224/45124* (2013.01); *H01L 2224/45144* (2013.01); *H01L 2224/48247* (2013.01); *H01L 2224/8538* (2013.01); *H01L 2224/85909* (2013.01)

(58) Field of Classification Search
CPC .... H01L 21/7685; H01L 24/85; B23K 20/004
See application file for complete search history.

(56) References Cited

U.S. PATENT DOCUMENTS

| 2004/0026480 A1* | 2/2004 | Imai ............... B23K 20/004 228/110.1 |
| 2007/0222042 A1* | 9/2007 | Lee ............... H01L 24/45 257/666 |

FOREIGN PATENT DOCUMENTS

| JP | H02-44740 A | 2/1990 |
| JP | H07-79062 A | 3/1995 |
| JP | 2002-026058 A | 1/2002 |
| JP | 2005-353903 A | 12/2005 |

* cited by examiner

*Primary Examiner* — Mohammad Choudhry
(74) *Attorney, Agent, or Firm* — McDermott Will & Emery LLP

(57) ABSTRACT

In wire bonding in assembling of a semiconductor device, an Al wire is coupled to a lead section by a wedge which is a bonding tool, thereafter, the wedge is withdrawn from the top of the lead section and a cutter is lowered and the Al wire is cut off in this state. Lowering of the cutter is stopped at a point in time that a stopper which is lowered simultaneously with lowering of the cutter has truck against the lead section and cutting of the Al wire is terminated by stopping of lowering of the cutter.

15 Claims, 16 Drawing Sheets

SEMICONDUCTOR DEVICE MANUFACTURING METHOD

CROSS-REFERENCE TO RELATED APPLICATIONS

The disclosure of Japanese Patent Application No. 2015-069375 filed on Mar. 30, 2015 including the specification, drawings and abstract is incorporated herein by reference in its entirety.

BACKGROUND

The present invention relates to a semiconductor device manufacturing method and, for example, relates to a semiconductor device manufacturing technology of performing wire bonding by using a wedge.

In a power type semiconductor device, there are cases where an electrode pad of a semiconductor chip and a lead section to be led out to the outside are coupled together by an Al (aluminum) wire in order to reduce an ON resistance. A wire diameter of the Al wire used in this case is, for example, about 200 μm to about μm, that is, is larger than those of an Au (gold) wire and a Cu (copper) wire.

In wire bonding using such a large-diameter Al wire as mentioned above, since it is necessary to also increase an area of a coupling part of the Al wire along which the Al wire is coupled with the lead section, wedge bonding is adopted and a bonding wedge (hereinafter, simply called a wedge) is used as a bonding tool. In wedge bonding, a technology of cutting the wire using a cutter or the like after wire coupling has been performed is known.

Incidentally, the technologies of cutting off the wire by using the cutter in wire bonding are disclosed, for example, in Japanese Unexamined Patent Application Publication Nos. Hei 7(1995)-79062, 2005-353903 and 2002-26058. In addition, a wire bonding technology that wedge bonding is adopted is disclosed, for example, in Japanese Unexamined Patent Application Publication No. Hei(1990)-44740.

SUMMARY

When cutting the wire by using the cutter after wire coupling has been performed in wedge bonding, it is unavoidable to lower and stop the cutter with high accuracy of such as extent that the cutter slightly bites into the lead section which is located directly under the wire in order to stably perform cutting of the wire.

For this purpose, when cutting the wire, the wedge which is attached to a drive section which is the same as that for the cutter is seated on a lead (wire) and a position where lowering of the cutter is stopped when the cutter is lowered is stabilized with the position of the wedge being set as a reference. In this cutting method, it is necessary to ensure a space for seating the wedge on the lead section behind (a first direction) the coupling part of the wire with the lead section on a part in the first direction that the lead section goes away from a semiconductor chip.

However, when it is intended to make a length in the first direction of the lead section short in association with miniaturization of the semiconductor device, it is difficult to ensure the space used for seating the wedge on the lead section and hence it becomes difficult to cut the wire. Consequently, it becomes difficult to promote miniaturization of the semiconductor device.

Other subject matters and novel features of the present invention will become apparent from the description of the present specification and appended drawings.

One semiconductor device manufacturing method according to one embodiment of the present invention includes the steps of (a) preparing a lead frame which includes a chip mounting section and a plurality of lead sections arranged around the chip mounting section, (b) after the step (a), mounting a semiconductor chip which includes a plurality of electrode pads on the chip mounting section of the lead frame and (c) after the step (b), electrically coupling together the plurality of electrode pads of the semiconductor chip and the plurality of lead sections individually by a plurality of Al wires. In addition, the step (c) includes the steps of (c1) electrically coupling together each electrode pad of the semiconductor chip and each Al wire by a wedge as a bonding tool and (c2) after the step (c1), pressing the Al wire against the lead section by the wedge and thereby electrically coupling together the Al wire and the lead section. The step (c) also includes the step of (c3) after the step (c2), lowering a cutter member and cutting the Al wire by the cutter member in a state of leaving the wedge withdrawn, from the top of the lead section and terminating cutting of the Al wire by the cutter member at a point in time that a stopper member which is lowered in accordance with lowering of the cutter member has struck against the lead section.

Another semiconductor device manufacturing method according to one embodiment of the present invention includes the steps of (a) preparing a lead frame which includes a chip mounting section and a plurality of lead sections arranged around the chip mounting section, (b) after the step (a), mounting a semiconductor chip which includes a plurality of electrode pads on the chip mounting section of the lead frame and (c) after the step (b), electrically coupling together the plurality of electrode pads of the semiconductor chip and the plurality of lead sections individually by a plurality of Al wires. In addition, the step (c) includes the steps of (c1) electrically coupling together each electrode pad of the semiconductor chip and each Al wire by a wedge as a bonding tool and (c2) after the step (c1), pressing the Al wire against the lead section by the wedge and thereby electrically coupling together the Al wire and the lead section. The step (c) also includes the step of (c3) after the step (c2), lowering a cutter member which is attached to a drive section which is the same as that for the wedge and cutting the Al wire by the cutter member in a state of leaving the wedge withdrawn from the top of the lead section and terminating cutting of the Al wire by the cutter member at a point in time that a stopper member which is lowered in accordance with lowering of the cutter member has struck against the lead section.

According to the above-mentioned one embodiment of the present invention, it is possible to promote miniaturization of the semiconductor device.

DETAILED DESCRIPTION

In the following embodiments, description on the same or similar parts is not repeated in principle unless otherwise necessary.

Further, although, in the following embodiments, description will be made by dividing into a plurality of sections or embodiments when necessary for the convenience sake, these are not unrelated to each another and these are related to each other such that one covers some or all of modified examples, details, supplemental, explanation and so forth of the other unless otherwise clearly stated.

In addition, in the following embodiments, in a case where the number of constitutional elements and so forth (the number of units, a numerical value, an amount, a range and so forth are included) is referred to, it is not limited to the specific number, and may be at least and/or not more than the specific number unless otherwise clearly stated and unless otherwise definitely limited to the specific number in principle.

In addition, in the following embodiments, it goes without saying that the constitutional element (an element step and so forth are also included) is not necessarily unavoidable unless otherwise clearly stated and unless otherwise thought to be clearly unavoidable in principle.

In addition, in the following embodiments, it goes without saying that when saying that "it is comprised from A", "it consists of A", "it has A", "it includes A" and so forth in regard to the constitutional element and so forth, they do not exclude elements other than the above unless otherwise clearly stated, in particular, that it means that element alone. Likewise, in the following embodiments, when the shapes of the constitutional elements and so forth, a positional relationship among them and so forth are referred to, the ones that are substantially approximate or similar to the shapes and so forth wall be included unless otherwise clearly stated and unless otherwise clearly thought that it is not so in principle. The same also applies to the above-mentioned numerical value and range.

In the following, the embodiments of the present invention will be described in detail on the basis of the drawings. Incidentally, in all of the drawings depicted in order to describe the embodiments, the same numerals are assigned to members having the same functions and repetitive description thereof is omitted. In addition, for easy understanding of the drawings, there are cases where hatching is applied even to a plan view.

EMBODIMENT

Figure 1:
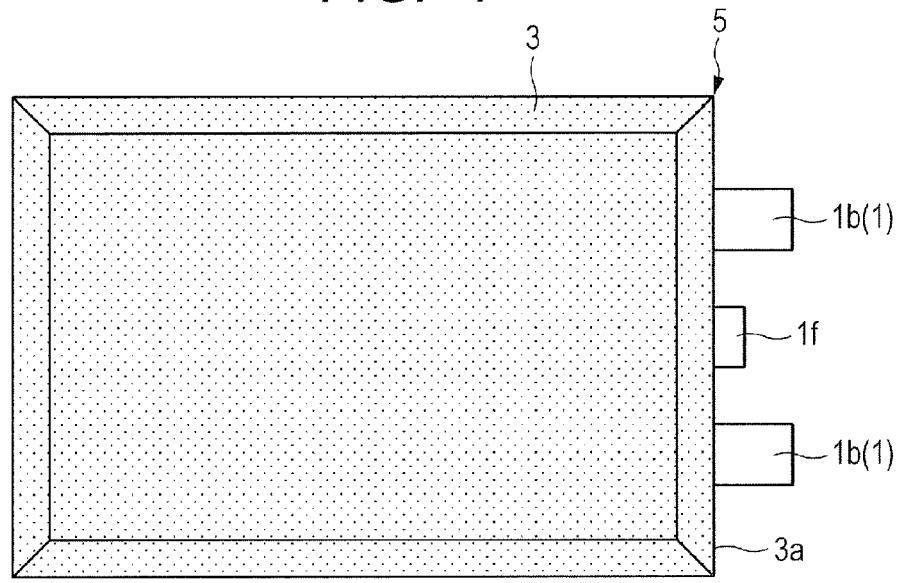
FIG. 1 is a plan view illustrating one example of a structure of a semiconductor device manufactured by a semiconductor device manufacturing method according to one embodiment of the present invention.
Figure 2:
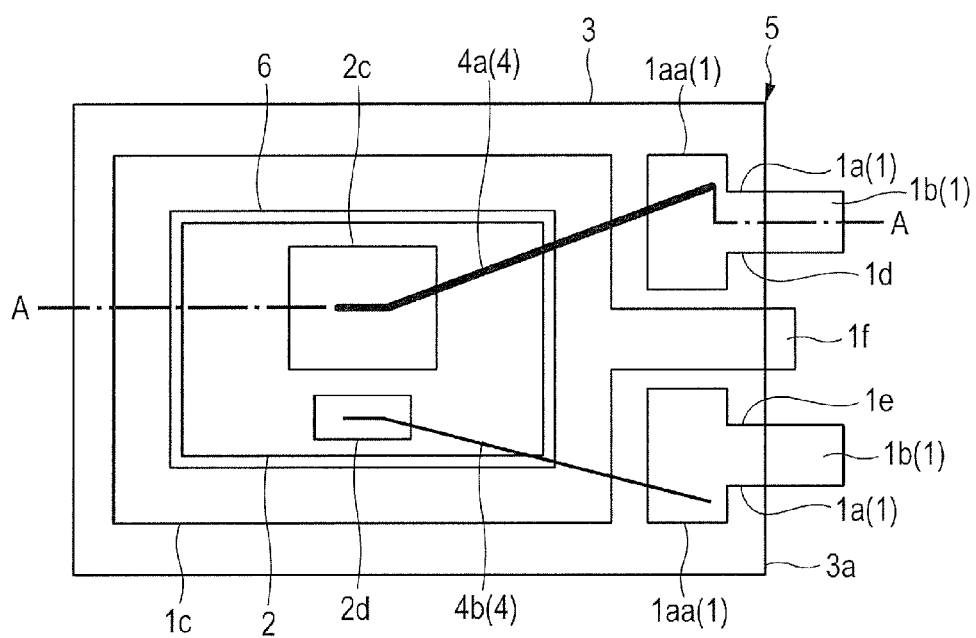
FIG. 2 is a plan view illustrating one example of an internal structure of the semiconductor device illustrated in FIG. 1 through a sealing element.
Figure 3:
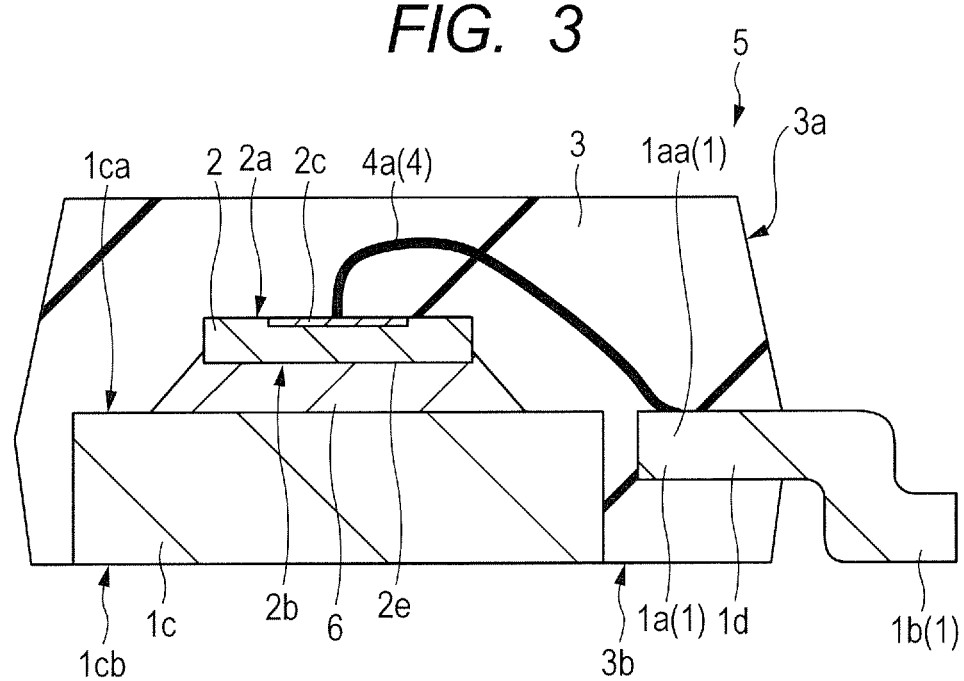
FIG. 3 is a sectional diagram illustrating one example of the structure taken along the line A-A in FIG. 2.
Figure 4:
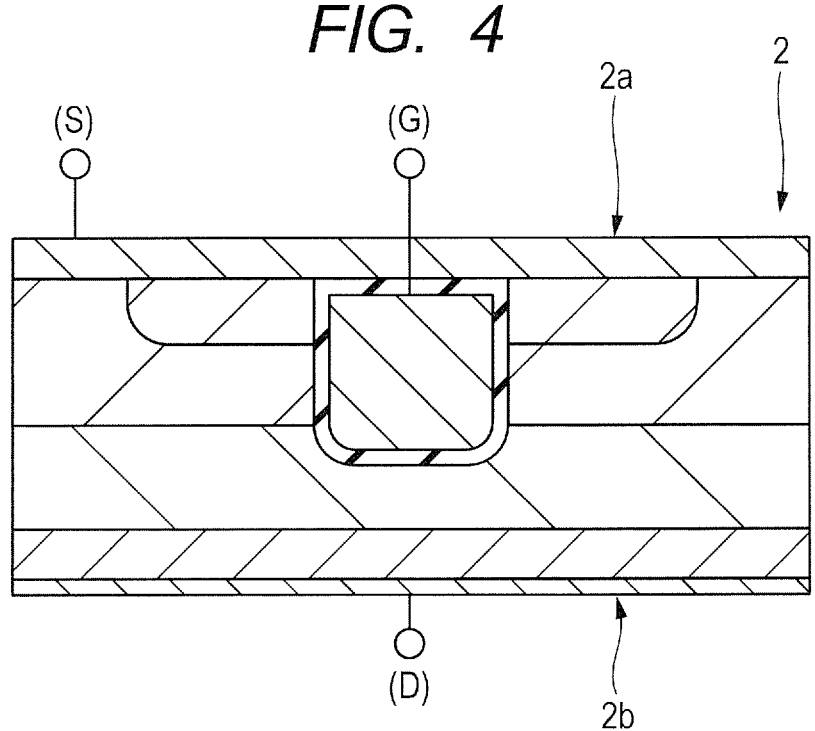
FIG. 4 is a sectional diagram illustrating one example of a structure of a main part of a semiconductor chip to be mounted on the semiconductor device illustrated in FIG. 1.

FIG. 1 is a plan view illustrating one example of a structure of a semiconductor device which has been manufactured by a semiconductor device manufacturing method according to one embodiment of the present invention (hereinafter, simply referred to as the semiconductor device according to the present embodiment), FIG. 2 is a plan view illustrating one example of an internal structure of the semiconductor device illustrated in FIG. 1 through a sealing element, FIG. 3 is a sectional diagram illustrating one example of the structure taken along the A-A line in FIG. 2 and FIG. 4 is a sectional diagram illustrating one example of a structure of a main part of a semiconductor chip to be mounted on the semiconductor device illustrated in FIG. 1.
<Structure of Semiconductor Device>

The semiconductor device according to the present embodiment illustrated in FIG. 1 to FIG. 3 is a semiconductor package which includes a sealing element 3 which seals a semiconductor chip (also called a pellet) 2 and is made of insulating resin and so forth and a plurality of lead sections 1 located inside and outside of the sealing element 3. Incidentally, each of the plurality of lead sections 1 includes an inner lead section 1a which is covered with the sealing element 3 and an outer lead section 1b which is exposed to the outside (projects outwards) from the sealing element 3 and the plurality (here, two lead sections) of outer lead sections 1b respectively configure terminals (outer terminals) to be coupled to the outside of the semiconductor device.

Then, in the semiconductor device according to the present embodiment, as illustrated in FIG. 2 and FIG. 3, the plurality of outer lead sections 1b project outwards from a desired one side surface 3a of the sealing element 3. Further, as illustrated in FIG. 3, a lower surface 1cb of a plate-shaped chip mounting section (also called an island, a die pad, a header, a tub or the like) 1c which supports the semiconductor chip 2 on its upper surface (a chip mounting surface) 1ca is exposed to the outside from a lower surface 3b of the sealing element 3.

In addition, each of the outer lead sections 1b of the plurality of lead sections 1 is bent into a gull wing shape.

In the present embodiment, description will be made by taking a power device 5 as one example of the semiconductor device including the above-mentioned structure. For example, a vertical power MISFET (Metal Insulator Semiconductor Field Effect Transistor) having a trench gate type structure is formed on the semiconductor chip 2 as a power transistor. A device structure of the power MISFET is such that a trench is formed in a surface and a gate is embedded in the trench as illustrated in FIG. 4. The power MISFET includes a drain (D) electrode formed on a back surface 2b of the semiconductor chip 2, a source (S) electrode formed on a principal surface 2a of the semiconductor chip 2 and a gate (G) electrode formed on the principal surface 2a of the semiconductor chip 2 and a large current is applied to the back surface 2b of the semiconductor chip 2. In addition, though not illustrated in the drawings, the power transistor may be a bipolar transistor, an IGET (Insulated Gate Bipolar Transistor) and so forth.

A detailed structure of the power device 5 will be described with reference to FIG. 1 to FIG. 3. The power device 5 includes the chip mounting section 1c which includes the upper surface 1ca (the chip mounting surface) and the lower surface 1cb which is opposite to the upper surface 1ca and the semiconductor chip 2 which is mounted on the upper surface 1ca of the chip mounting section 1c via a solder material 6 to be used as a bonding material. The semiconductor chip 2 includes the principal surface 2a, the back surface 2b located on the opposite side of the principal surface 2a, plurality of electrode pads (also called the first electrodes, bonding electrodes, bonding pads or the like) 2c and 2d formed on the principal surface 2a and is mounted on the chip mounting section 1c such that the back surface 2b faces the upper surface 1ca of the chip mounting section 1c.

Incidentally, a back surface electrode 2e is formed on a back surface 2b of the semiconductor chip 2 and the back surface electrode 2e is configured as the drain (D) electrode in the power device 5 according to the present embodiment. Accordingly, it is desirable that, the back surface 2b (the back surface electrode 2e) of the semiconductor chip 2 be electrically and mechanically coupled with the chip mounting section 1c by a conductive bonding material. Therefore, in the power device 5, the solder material 6 is used as the conductive bonding material.

In addition, since the drain electrode (the back surface electrode 2e) is formed on the back surface 2b of the semiconductor chip 2, an amount of heat generated from the semiconductor chip 2 is large. Therefore, the back surface 2b side of the semiconductor chip 2 serves as a heat radiation path by using the solder material 6 as the bonding material (a die bonding material). That is, the power device 5 is structured such that heat is radiated from the back surface 2b side of the semiconductor chip 2 toward the chip mounting section 1c via the solder material 6 and therefore the lower surface 1cb of the chip mounting section 1c is exposed to the lower surface 3b of the sealing element 3.

In addition, as illustrated in FIG. 2, in a planar view of the chip mounting section 1c, the inner lead sections 1a of the plurality (here, two lead sections) of lead sections 1 which are arranged along one side of the chip mounting section 1c and the electrode pads 2c and 2d of the semiconductor chip 2 are electrically coupled together respectively by conductive wires. Incidentally, a wide-width part 1aa which is increased in lead width is formed on an end part of each inner lead section 1a located on the semiconductor chip 2 and an Al wire 4 is coupled to the wide-width part 1aa.

In addition, a plurality of coupling electrodes of the semiconductor chip 2 in the power device 5 according to the present embodiment include the electrode pad (the source electrode) 2c and the electrode pad (the gate electrode) 2d which is smaller in size than the electrode pad 2c in a planar view.

In addition, the sealing element 3 illustrated in FIG. 1 to FIG. 3 includes four side surfaces 3a and the two outer lead sections 1b project from one of the side surfaces 3a. Further, the sealing element 3 seals part (the upper surface 1ca side) of the chip mounting section 1c, the semiconductor chip 2 and the plurality of Al wires 4 such that the lower surface 1cb of the chip mounting section 1c is exposed to the lower surface 3b of the sealing element 3 as illustrated in FIG. 3.

Since the semiconductor device according to the present embodiment is configured as the power device 5, as illustrated in FIG. 2, the plurality of lead sections 1 (the outer lead sections 1b) which project from the side surface 3a of the sealing element 3 are configured as a source lead (S) 1d and a gate lead (G) 1e. In addition, as illustrated in FIG. 3, the back surface 2b of the semiconductor chip 2 is configured as the drain (D) electrode (the back surface electrode 2e) as described above and therefore the lower surface 1cb of the chip mounting section 1c which is exposed to the lower surface 3b of the sealing element 3 is configured as the drain (D) electrode.

Incidentally, each of the plurality of outer lead sections 1b is formed integrally with each inner lead section 1a. As illustrated in FIG. 2, the source lead 1d of the outer lead section 1b is integrally linked with the source lead 1d of the inner lead section 1a and the gate lead 1e of the outer lead section 1b is integrally linked with the gate lead 1e of the inner lead section 1a.

Then, an Al wire 4a which is larger than an Al wire 4b (a gate wire) in diameter is electrically coupled to the wide-width part 1aa of the source lead 1d and further the Al wire 4a is electrically coupled to the electrode pad (the source electrode) 2c in electrodes (bonding electrodes) of the semiconductor chip 2.

That is, since a current which is larger than a gate current is applied to the source lead 1d in the plurality of lead sections 1, the source lead 1d and the electrode pad (the source electrode) 2c of the semiconductor chip 2 are electrically coupled together via the large-diameter Al wire 4a.

On the other hand, the Al wire 4b which is smaller than the Al wire 4a in diameter is electrically coupled to the wide-width part 1aa of the gate lead 1e of the inner lead section 1a and further the AL wire 4b is electrically coupled to the electrode pad (the gate electrode) 2d in the electrodes (the bonding electrode) of the semiconductor chip 2.

In addition, as illustrated in FIG. 2, a hanging lead 1f which is linked with the chip mounting section 1c projects from the side surface 3a of the sealing element 3.

Incidentally, the chip mounting section 1c, the hanging lead 1f which is linked with the chip mounting section 1c and the plurality of lead sections 1 including the inner lead section 1a and the outer lead section 1b are made of, for example, a Cu alloy which contains Cu (copper) as a principal component. In addition, in the present embodiment, the bonding material for coupling together the semiconductor chip 2 and the chip mounting section 1c is, for example, the solder material 5. Then, the wire is made of, for example, Al (aluminum) and so forth. In this case, the diameter of the Al wire 4a is, for example, about 300 μm to about 500 μm and the diameter of the Al wire 4b is, for example, about 125 μm. In addition, the sealing element 3 is made of, for example, thermosetting epoxy resin and so forth. However, the dimensions and materials of the above mentioned members are not limited to the above mentioned dimensions and materials.

<Semiconductor Device Manufacturing Method>

Figure 5:
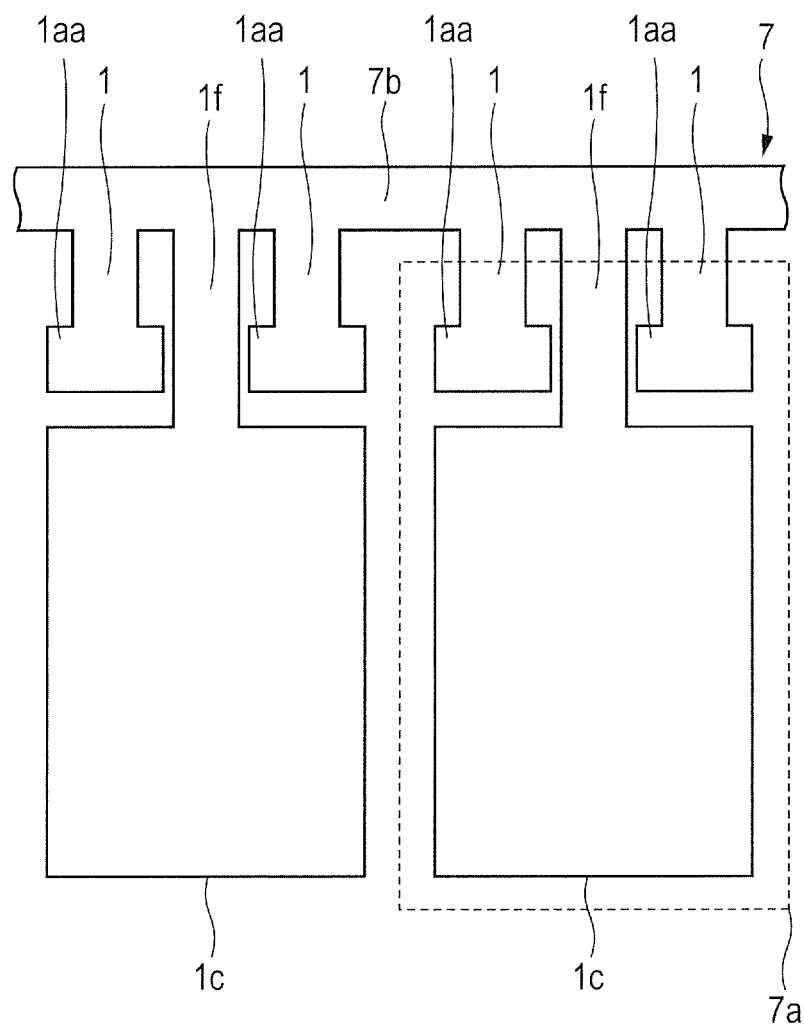
FIG. 5 is a partial plan view illustrating one example of a structure of a main part of a lead frame to be used in assembling of the semiconductor device illustrated in FIG. 1.
Figure 6:
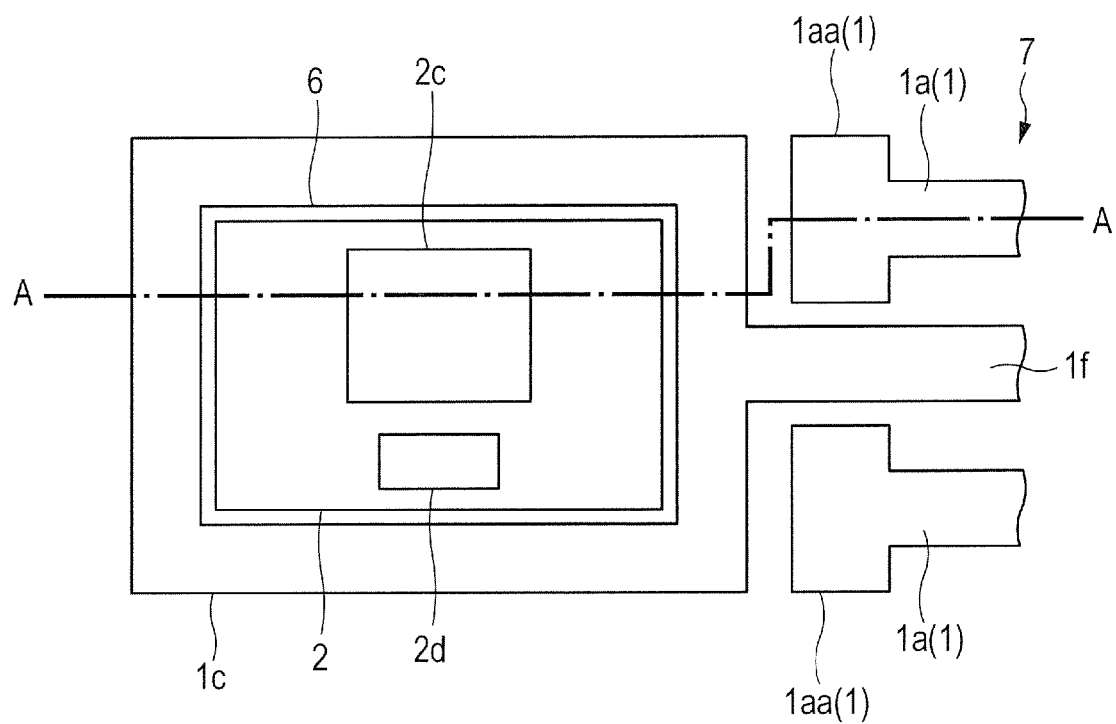
FIG. 6 is a partial plan view illustrating one example of a structure obtained after the bonding has been performed in assembling of the semiconductor device illustrated in FIG. 1.
Figure 7:
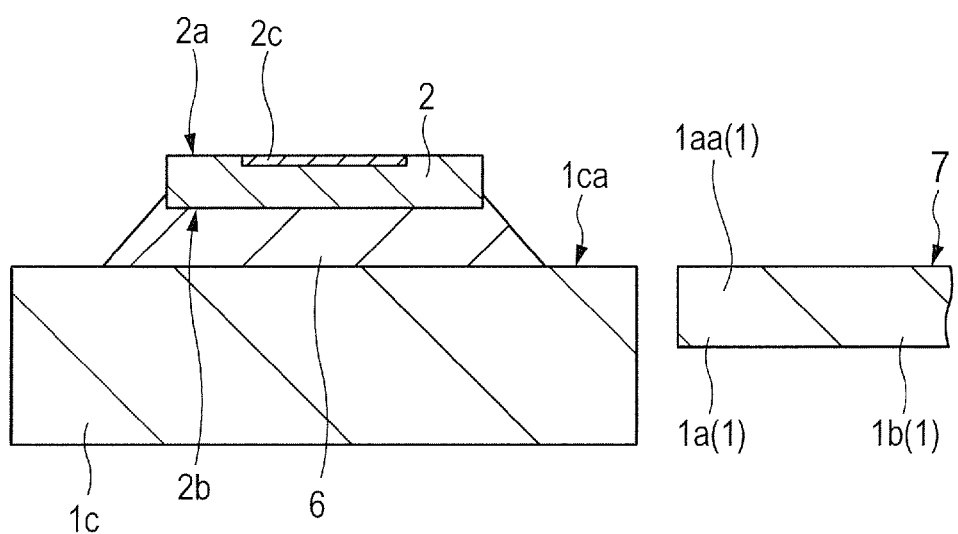
FIG. 7 is a partial sectional diagram illustrating one example of the structure taken along the A-A line in FIG. 6.
Figure 8:
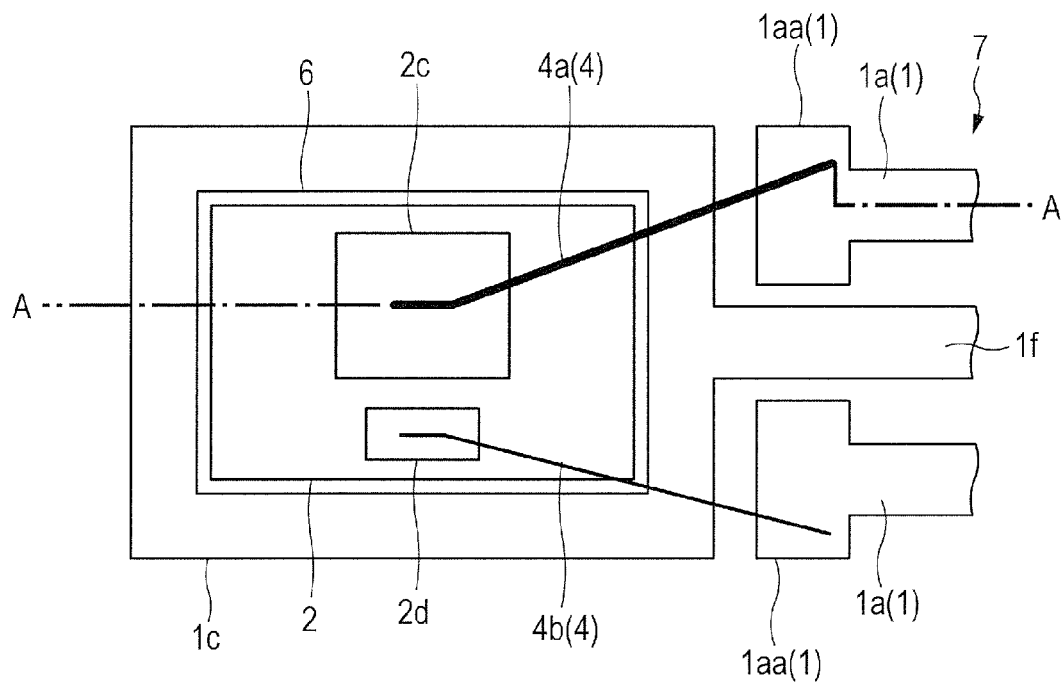
FIG. 8 is a partial plan view illustrating one example of a structure obtained after wire bonding has been performed in assembling of the semiconductor device illustrated in FIG. 1.
Figure 9:
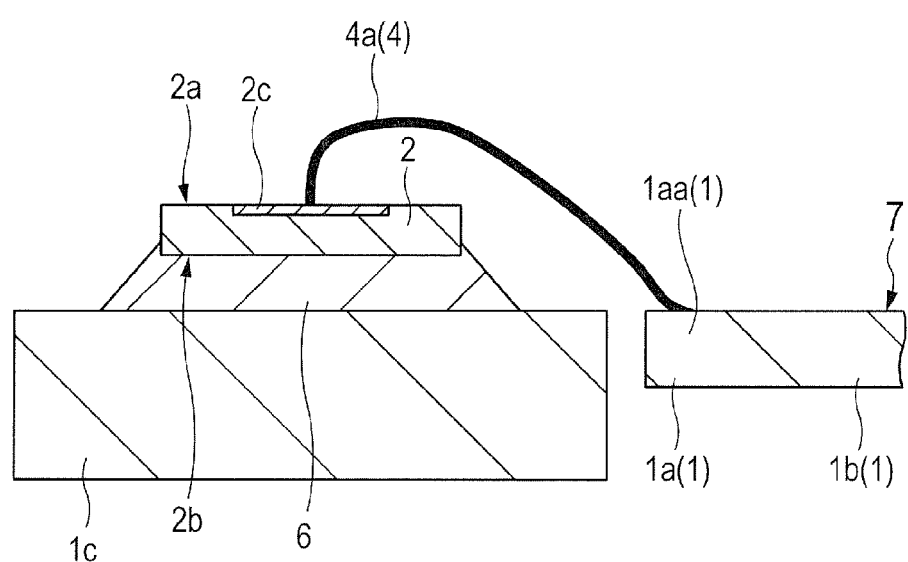
FIG. 9 is a partial sectional diagram illustrating one example of the structure taken along the A-A line in FIG. 8.

FIG. 5 is a partial plan view illustrating one example of a structure of a main part of a lead frame to be used in assembling of the semiconductor device illustrated in FIG. 1, FIG. 6 is a partial plan view illustrating one example of a structure obtained after the bonding has been performed in assembling of the semiconductor device illustrated in FIG. 1 and FIG. 7 is a partial sectional diagram illustrating one example of the structure taken along the A-A line in FIG. 6. In addition, FIG. 8 is a partial plan view illustrating one example of a structure obtained after wire bonding has been performed in assembling of the semiconductor device illustrated in FIG. 1 and FIG. 9 is a partial sectional diagram illustrating one example of the structure taken along the A-A line in FIG. 8.

1. Preparation for Lead Frame

First, a lead frame 7 of a configuration as illustrated in FIG. 5 is prepared. A plurality of device regions 7a in each of which it is possible to form one power device 5 illustrated in FIG. 1 are formed in the lead frame 7. The chip mounting section 1c and the plurality of lead sections 1 which are arranged on the side (in the vicinity, around and so forth) are formed in each device region 7a. In the lead frame 7 according to the present embodiment, one chip mounting section 1c which is square in a planar view and two lead sections 1 and one hanging lead 1f which are arranged corresponding to one side of the square chip mounting section 1c are included in each device region 7a.

In addition, each lead section 1 and the hanging lead 1f are respectively linked with a frame section 7b and are supported by the frame section 7b at their ends on the sides opposite to the chip mounting section 1c sides thereof. The chip mounting section 1c is supported by the hanging lead 1f which is linked with the frame section 7b.

Then, the wide-width part 1aa which is increased in lead width is formed on a chip mounting section 1c side end part of each lead section 1. The wide-width part 1aa is a region to which the wire is to be coupled.

2. Die Bonding

After the lead frame has been prepared, die bonding is performed as illustrated in FIG. 6 and FIG. 7. That is, the semiconductor chip 2 is mounted on the upper surface 1ca of the chip mounting section 1c of the lead frame 7 via the bonding material (the die bonding material). In the present embodiment, the solder material 6 is used as the bonding material. Thereby, the back surface 2b of the semiconductor chip 2 is adhered to the upper surface 1c of the chip mounting section 1c.

Incidentally, as illustrated in FIG. 6, the plurality of electrode pads 2c and 2d are formed on the principal surface 2a of the semiconductor chip 2.

3. Wire Bonding

After the die bonding has been performed, wire bonding is performed as illustrated in FIG. 8 and FIG. 9. Here, the electrode pads 2c and 2d on the principal surface 2a of the semiconductor chip 2 and the inner lead sections 1a which respectively correspond to the electrode pads 2c and 2d are electrically coupled together by the Al wires 4.

Describing in detail, the electrode pad 2c of the semiconductor chip 2 and one inner lead section 1a (the source lead 1d illustrated in FIG. 2) are electrically coupled together by the Al wire 4a and the electrode pad 2d of the semiconductor chip 2 and the other inner lead section 1a (the gate lead 1a illustrated in FIG. 2) are electrically coupled together by the Al wire 4b.

Incidentally, in the wire bonding of the present embodiment, since the large-diameter Al wire 4a is handled, wedge bonding which uses a wedge 8 illustrated in FIG. 10 which will be described later as a bonding tool is adopted.

In a wire bonding process according to the present embodiment, first, the wire bonding is performed on the source electrode (the electrode pad 2c) illustrated in FIG. 2. That is, the electrode pad (the source electrode) 2c of the semiconductor chip 2 and the source lead 1d (the inner lead section 1a) illustrated in FIG. 2 are electrically coupled together by the large-diameter Al wire 4a by wedge bonding.

In that occasion, the inner lead section 1a side (a second side) of the Al wire 4a is coupled to the wide-width part 1aa of the inner lead section 1a.

Then, after the wire bonding has been performed on the source electrode, the wire boding is perforated on the gate electrode (the electrode pad 2d). That is, the electrode pad (the gate electrode) 2d of the semiconductor chip 2 and the gate lead 1e (the inner lead section 1a) illustrated in FIG. 2 are electrically coupled together by the Al wire 4b which is smaller than the Al wire 4a in diameter by the wedge bonding.

In that occasion, the inner lead part 1a side (the second side) of the Al wire 4b is coupled to the wide-width part 1aa of the inner lead section 1a similarly to the case of the soured electrode.

Next, the wire bonding (the wedge bonding) according to the present embodiment will be described in detail. Incidentally, although, here, description will be made by taking a case of wedge-bonding the large-diameter Al wire 4a by way of example, also the small-diameter Al wire 4b is wedge-bonded by the same bonding method as that for the Al wire 4a.

Figure 10:
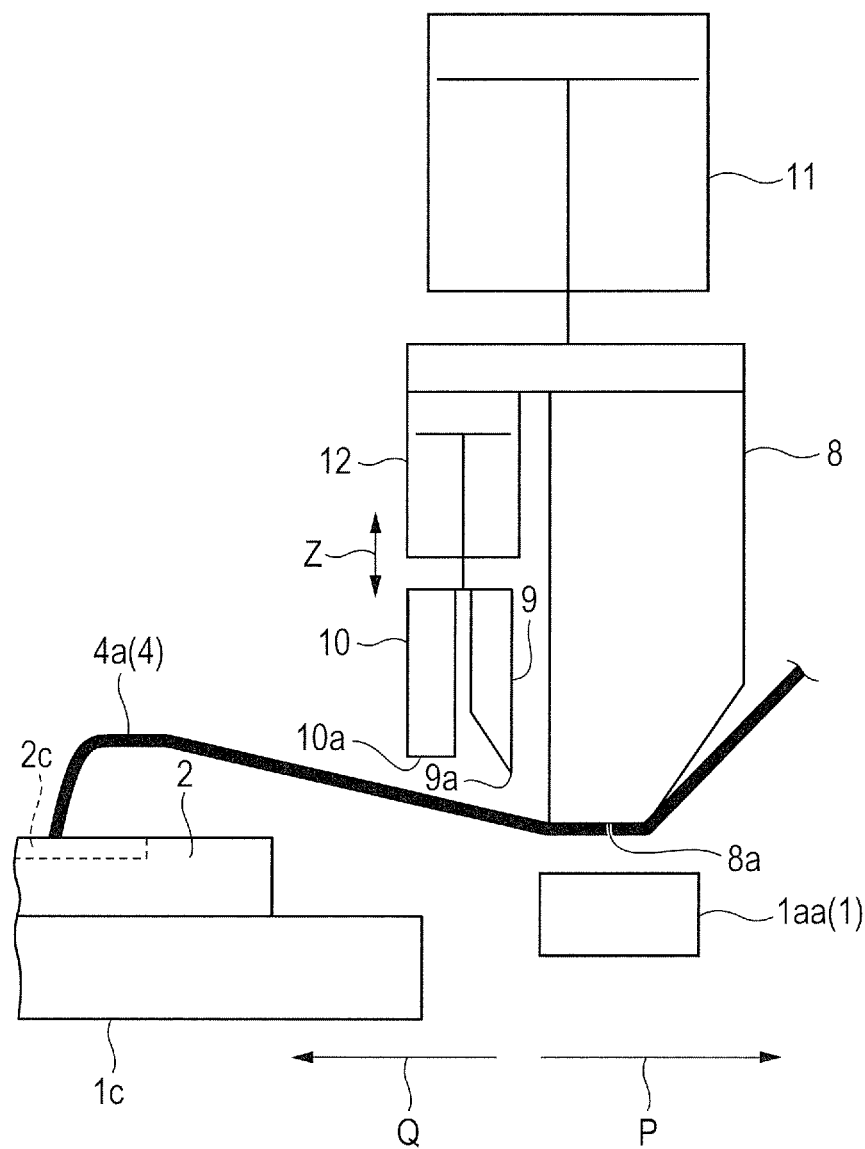
FIG. 10 is a schematic diagram illustrating one example of a structure of a drive section of a wedge bonder used in wire bonding according to the embodiment of the present invention.
Figure 11:
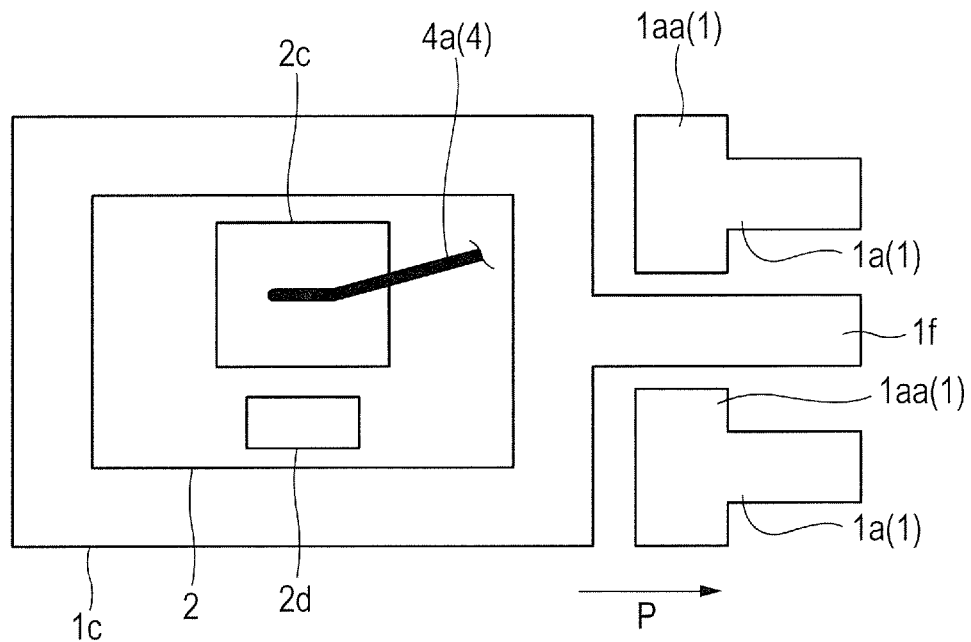
FIG. 11 is a partial plan view illustrating one example of a structure obtained after first bonding has been performed in a wire bonding process in assembling of the semiconductor device illustrated in FIG. 1.
Figure 12:
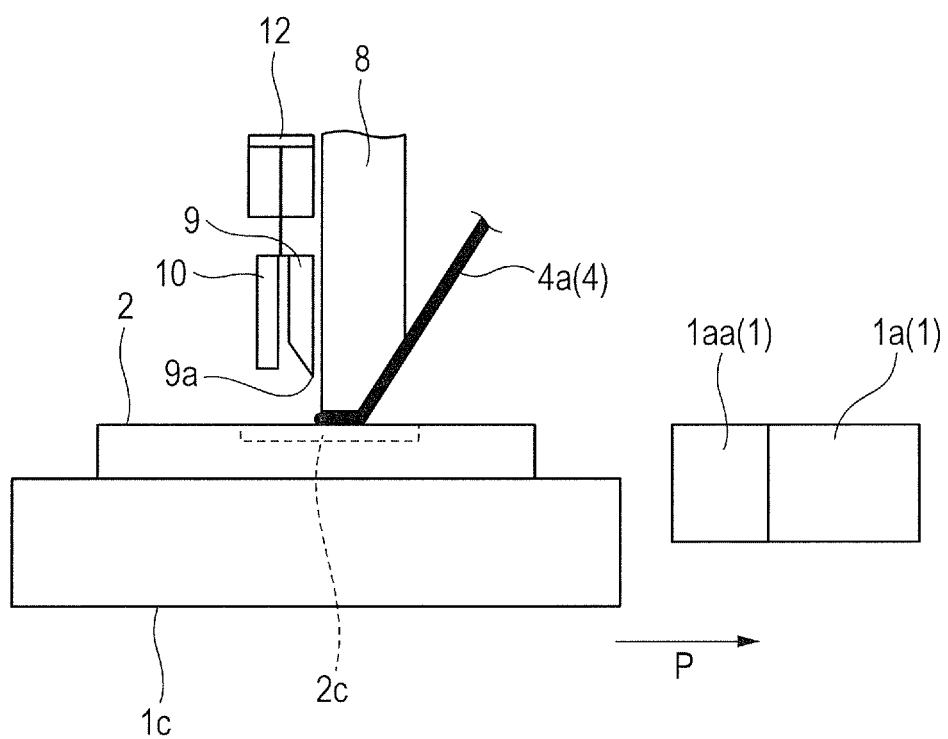
FIG. 12 is a partial schematic diagram of one example that the structure in FIG. 11 is illustrated in combination with a wedge operation.
Figure 13:
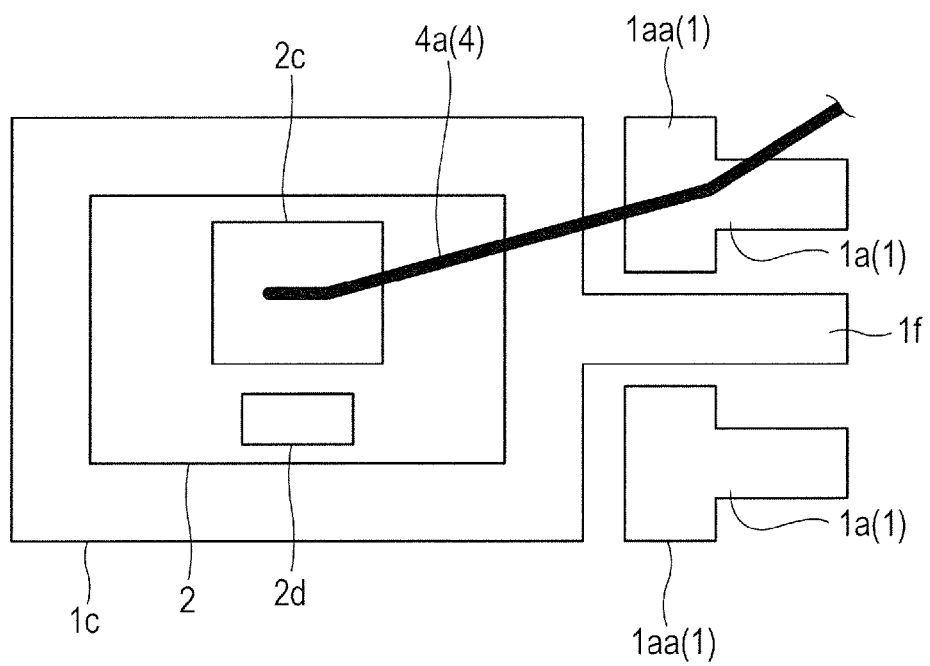
FIG. 13 is a partial plan view illustrating one example of a structure obtained after second bonding has been performed in the wire bonding process in assembling of the semiconductor device illustrated in FIG. 1.
Figure 14:
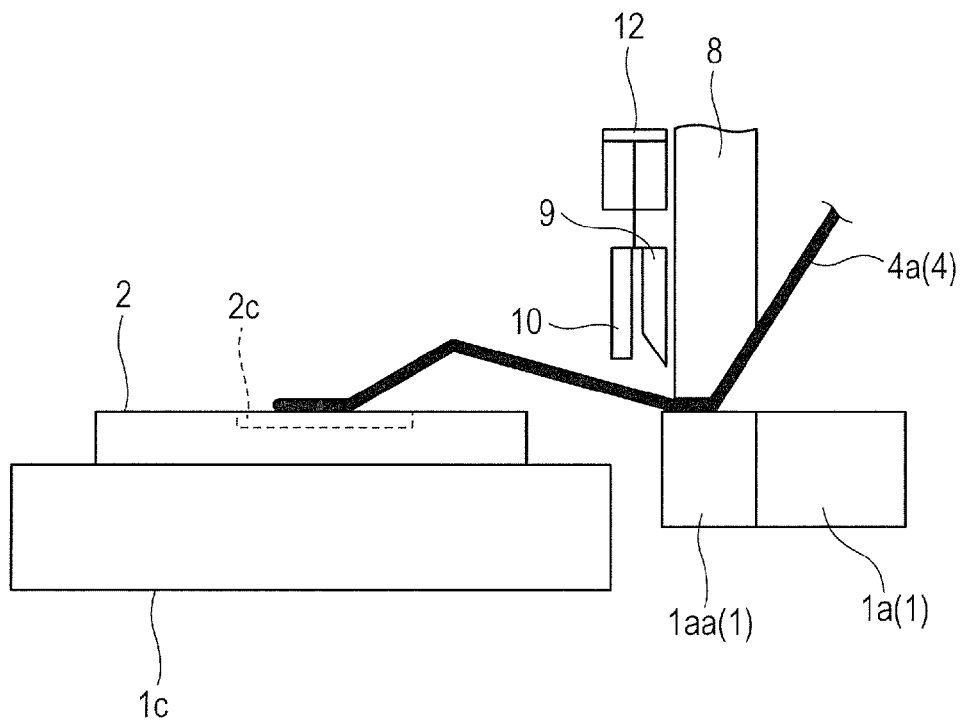
FIG. 14 is a partial schematic diagram of one example that the structure in FIG. 13 is illustrated in combination with the wedge operation.
Figure 15:
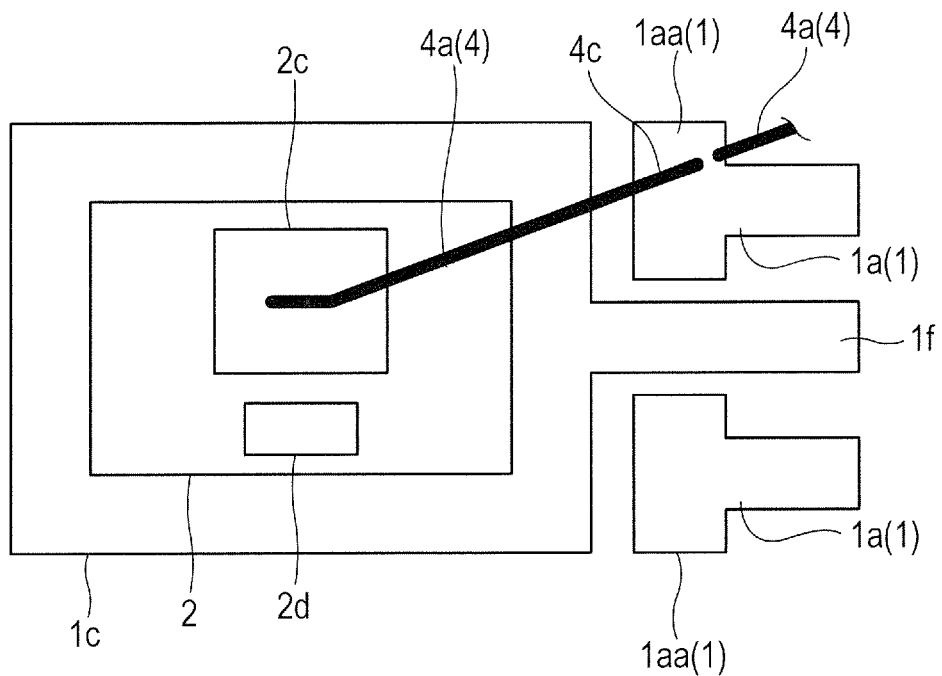
FIG. 15 is a partial plan view illustrating one example of a structure obtained when wire cutting is performed in the wire bonding process in assembling of the semiconductor device illustrated in FIG. 1.
Figure 16:
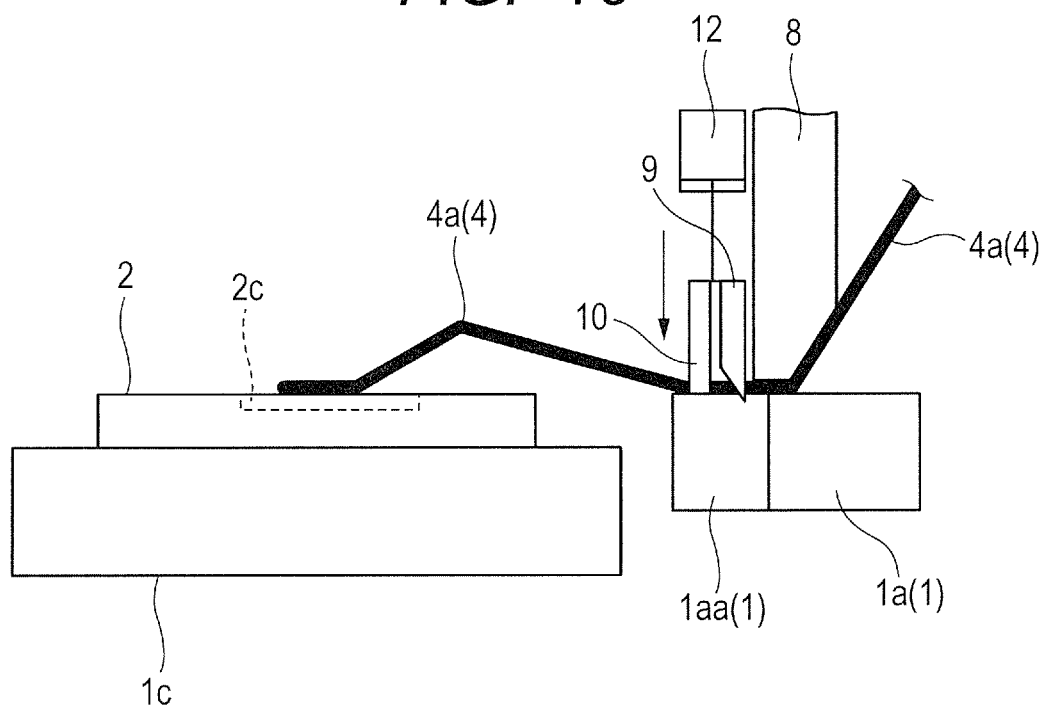
FIG. 16 is a partial schematic diagram of one example that the structure in FIG. 15 is illustrated in combination with the wedge operation.
Figure 17:
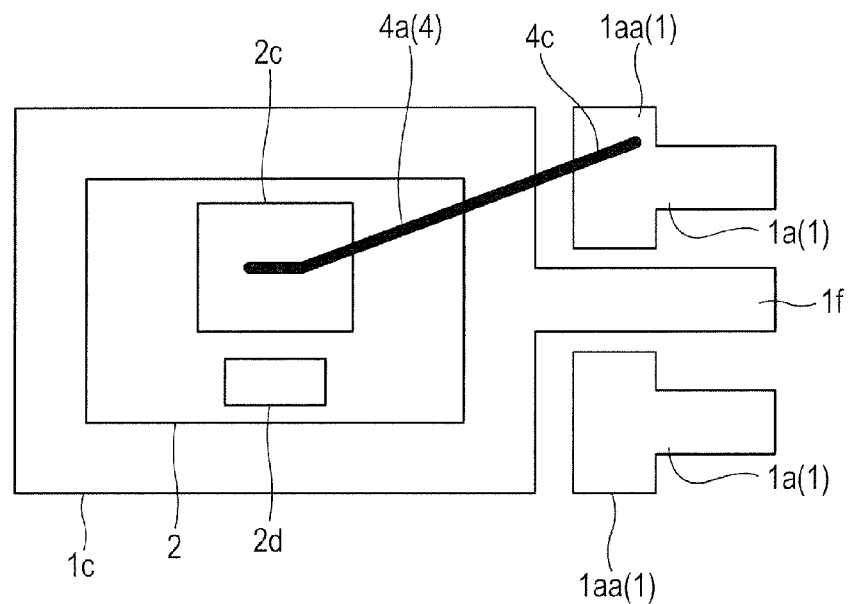
FIG. 17 is a partial plan view illustrating one example of a structure obtained after the wire cutting has been performed in the wire bonding process in assembling of the semiconductor device illustrated in FIG. 1.
Figure 18:
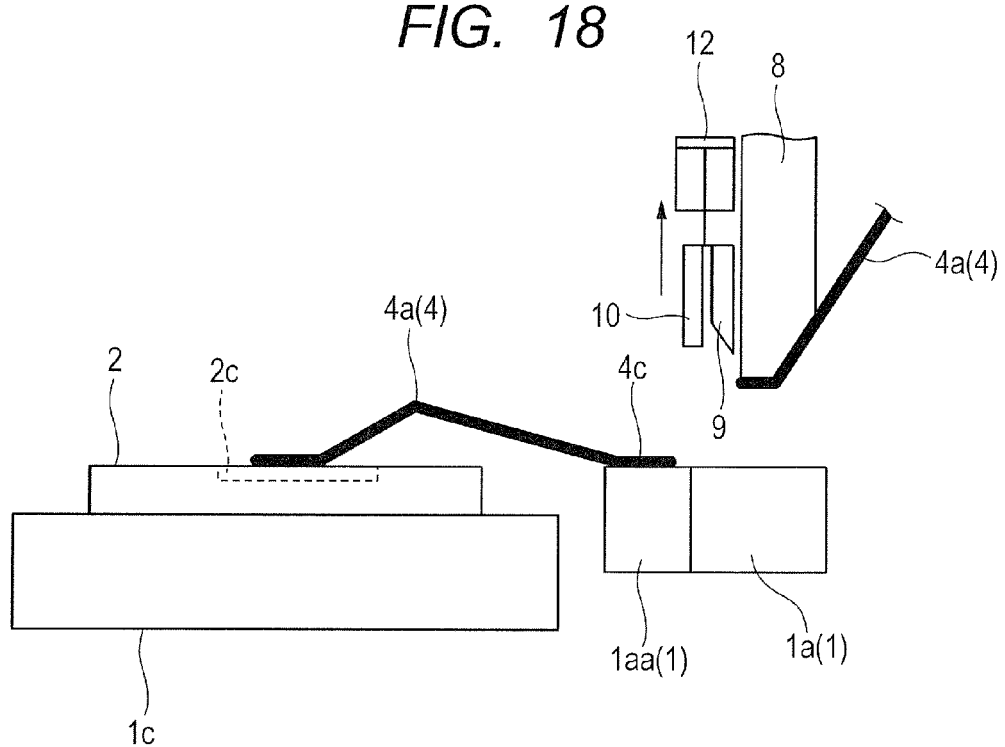
FIG. 18 is a partial schematic diagram of one example that the structure in FIG. 17 is illustrated in combination with the wedge operation.

FIG. 10 is a schematic diagram illustrating one example of a structure of a drive section for a wedge bonder used in the wire bonding according to the embodiment of the present invention, FIG. 11 is a partial plan view illustrating one example of a structure obtained after first bonding has been performed in the wire bonding process in assembling of the semiconductor device illustrated in FIG. 1 and FIG. 12 is a partial schematic diagram of one example that the structure in FIG. 11 is illustrated in combination with a wedge operation. In addition, FIG. 13 is a partial plan view illustrating one example of a structure obtained after second bonding has been performed in the wire bonding process in assembling of the semiconductor device illustrated in FIG. 1, FIG. 14 is a partial schematic diagram of one example that the structure in FIG. 13 is illustrated in combination with the wedge operation and FIG. 15 is a partial plan view illustrating one example of a structure obtained when wire cutting is performed in the wire bonding process in assembling of the semiconductor device illustrated in FIG. 1. Further, FIG. 16 is a partial schematic diagram of one example that the structure in FIG. 15 is illustrated in combination with the wedge operation, FIG. 17 is a partial plan view illustrating one example of a structure obtained after the wire cutting has been performed in the wire bonding process in assembling of the semiconductor device illustrated in FIG. 1 and FIG. 18 is a partial schematic diagram of one example that the structure in FIG. 17 is illustrated in combination with the wedge operation.

First, one example of the structure of the drive section for the wedge bonder used in the wedge bonding according to the present embodiment will be described with reference to FIG. 10.

As illustrated in FIG. 10, in the wedge bonder according to the present embodiment, a cutter (a cutter member) 9 adapted to cut the wire is attached to a first actuator (the drive section) 11 which is the same as that for the wedge 8. In addition, a stopper (the stopper member) 10 adapted to determine a stop position where the cutter 9 which is being lowered is to be stopped is installed.

The stopper 10 is attached to the first actuator 11 which is the same as that for the wedge 8 and the cutter 9.

That is, in the wedge bonder illustrated in FIG. 10, the cutter 9 for cutting the wire and the stopper 10 for determining the stop position where the cutter 9 which is being lowered is to be stopped are attached to the first actuator for moving the wedge 8 vertically.

Then, the cutter 9 and the stopper 10 are arranged so as to move integrally with the wedge 8 and are movably attached to the first actuator (the drive section) 11 which is the same as that for the wedge 8.

It is possible to reduce the size of the device by attaching the cuter 9 and the stopper 10 to the first actuator (the drive part) 11 which is the same as that for the wedge 8 in this way.

In addition, it is possible to simplify a control system for each operation. Further, it is possible to move the wedge 8 and the cutter 9 integrally with the stopper 10 in a horizontal direction (an X-Y direction).

In addition, the cutter 9 and the stopper 10 are attached to a second actuator 12 which is attached to the wedge 8 such that both of the cutter 9 and the stopper 10 are moved integrally with each other. Thereby, it is possible for the cutter 9 and the stopper 10 to move integrally with the wedge 8 and it is also possible for the cutter 9 and the stopper 10 to move in a Z-system (a vertical direction) independently of the wedge 8.

Owing to the above-mentioned structure, the cutter 9 and the stopper 10 are moved vertically in association with vertical movement of the wedge 8 together with the wedge 8 by being driven by the first actuator 11. Further, it is possible to move the cutter 9 and the stopper 10 vertically with the wedge 8 being fixed by being driven by the second actuator 12 attached to the wedge 8.

Thereby, the wedge bonder according to the present embodiment cuts the Al wire 4a by lowering the cutter 9 in a state of leaving the wedge 8 withdrawn from the top of the lead section 1 after termination of the second bonding performed on the lead section 1 and terminates cutting of the Al wire 4a by the cutter 9 at a point in time that the stopper 10 which is lowered in accordance with lowering of the cutter 9 has struck against the lead section 1 when cutting the Al wire 4a.

That is, the stopper 10 is provided as a stopper member for stopping lowering of the cutter 9. When the stopper 10 which is lowered simultaneously with lowering of the cutter 9 strikes against the lead section 1, also lowering of the cutter is stopped and wire cutting by the cutter 9 is terminated at that point in time.

Incidentally, the wedge 8, the cutter 9 and the stopper 10 may be attached so as to be movable independently of one another.

In addition, as illustrated in FIG. 10, the stopper ID is arranged so as to sandwich the cutter 9 together with the wedge 8 in a first direction P that the wedge 8 goes away from the semiconductor chip 2. In other words, the cutter 9 is arranged between the wedge 8 and the stopper 10 in the first direction P. In further other words, the stopper 10 is arranged in front of the cutter 9 in a second direction Q which is opposite to the first direction P.

In addition, a lower end part (a lower surface) 10a of the stopper 10 and a lower end part (the edge) 9a of the cutter 9 are arranged at positions higher than a lower end part (a lower surface) 8a of the wedge 8.

Further, the lower end part (the edge) 10a of the cutter 9 projects downward slightly beyond the lower end part 10a of the stopper 10.

In addition, a length in the first direction P of the lower end part (the lower surface) 10a of the stopper 10 is made shorter than a length in the first direction P of the lower end part (the lower surface) of the wedge 8.

Next, a rough procedure of a tool operation to be performed ranging from first bonding to second boding of the wire bonding process according to the present embodiment will be described.

As illustrated in FIG. 11 and FIG. 12, the first bonding is performed. That is, wedge bonding is performed on the electrode pad 2c of the semiconductor chip 2. Here, the electrode pad 2c of the semiconductor chip 2 and the Al wire 4a are electrically coupled together by using the wedge 3.

At this time, as illustrated in FIG. 10, the lower end part (the lower surface) 10a of the stopper 10 and the lower end part (the edge) 9a of the cutter 9 are arranged at the positions higher than the lower end part (the lower surface) 8a of the wedge 8. Thereby, it is possible to avoid contact of the lower end part (the edge) 9 of the cutter 9 and the lower end part (the lower surface) 10a of the stopper with the principal surface 2a of the semiconductor chip 2 while wire bonding is being performed by pressing the Al wire 4a against the electrode pad 2c of the semiconductor chip 2 by the wedge 8.

That is, since the lower end part (the edge) 9a of the cutter 9 and the lower end part (the lower surface) 10a of the stopper 10 are in a state of being drawn upwards away from the lower end part (the lower surface) 8a of the wedge 8, it is possible to prevent the edge of the cutter from coming into contact with the surface (the principal surface 2a) of the semiconductor chip 2 while the wedge bonding is being performed.

Thereby, it is possible to prevent the cutter 9 and the stopper 10 from damaging the semiconductor chip 2 when performing the first bonding (when performing the wedge bonding on the semiconductor chip 2).

After completion of the first boding, the second boding is performed as illustrated in FIG. 13 and FIG. 14. Here, the Al wire 4a is pressed against the lead section 1 by the wedge 8 so as to electrically couple together the Al wire 4a and the lead section 1. Specifically, as illustrated in FIG. 13, the Al wire 4a is coupled to the wide-width part 1aa of the inner lead section 1a.

After wire coupling on the second side (the inner lead section 1a side) has been performed, as illustrated in FIG. 15 and FIG. 16, the Al wire 4a is cut by the cutter 9. Here, in a state of leaving the wedge 8 withdrawn from the top of the lead section 1 (the wide-width part 1aa of the inner lead section 1a), the cutter 9 is lowered and the Al wire 4a is cut by the cutter 9, and also lowering of the cutter 9 is stopped at a point in time that the stopper 10 which is lowered together with the cutter 9 has struck against the lead section 1. Cutting of the Al wire 4a is also completed by stopping of lowering of the cutter 9.

After wire cutting has been performed as illustrated in FIG. 17 and FIG. 18, the wedge 8, the cutter 9, the stopper 10 and the Al wire 4a are risen and withdrawn from the lead section 1. Thereby, the electrode pad 2c of the semiconductor chip 2 and the lead section 1 are coupled together by the Al wire 4a.

Next, details of the tool operation to be performed ranging from the second bonding to the wire cutting in the wire bonding process according to the present embodiment will be described.

Figure 19:
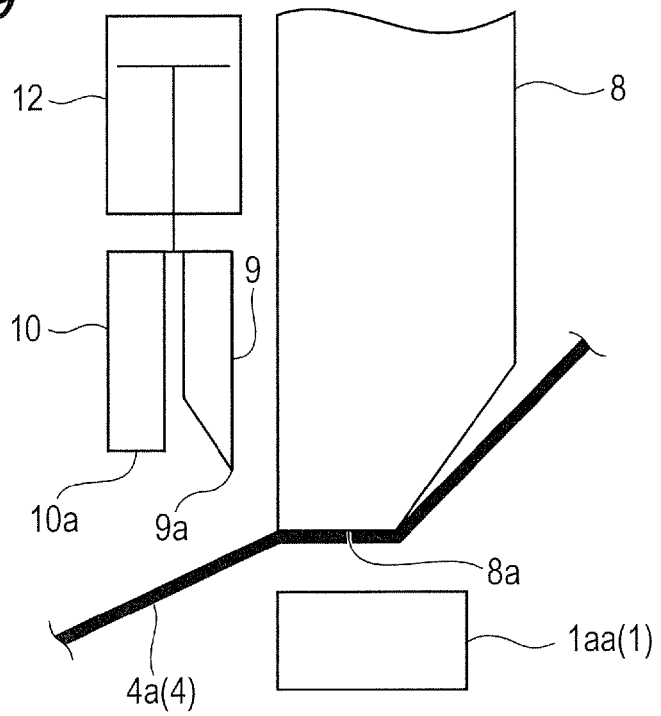
FIG. 19 is a schematic diagram illustrating one example of a tool operation when wedge bonding is performed in the wire boding process in assembling of the semiconductor device illustrated in FIG. 1.
Figure 20:
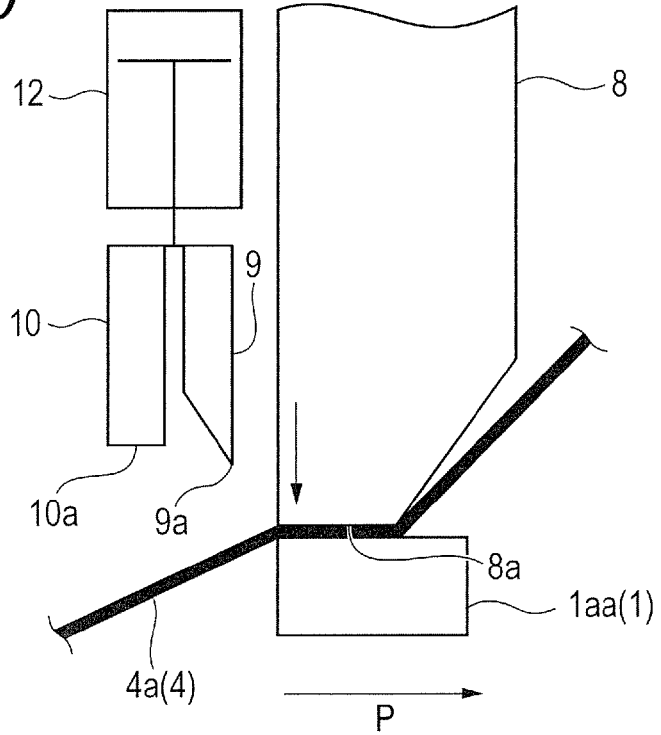
FIG. 20 is a schematic diagram illustrating one example of the tool operation when wedge bonding is performed in the wire boding process in assembling of the semiconductor device illustrated in FIG. 1.
Figure 21:
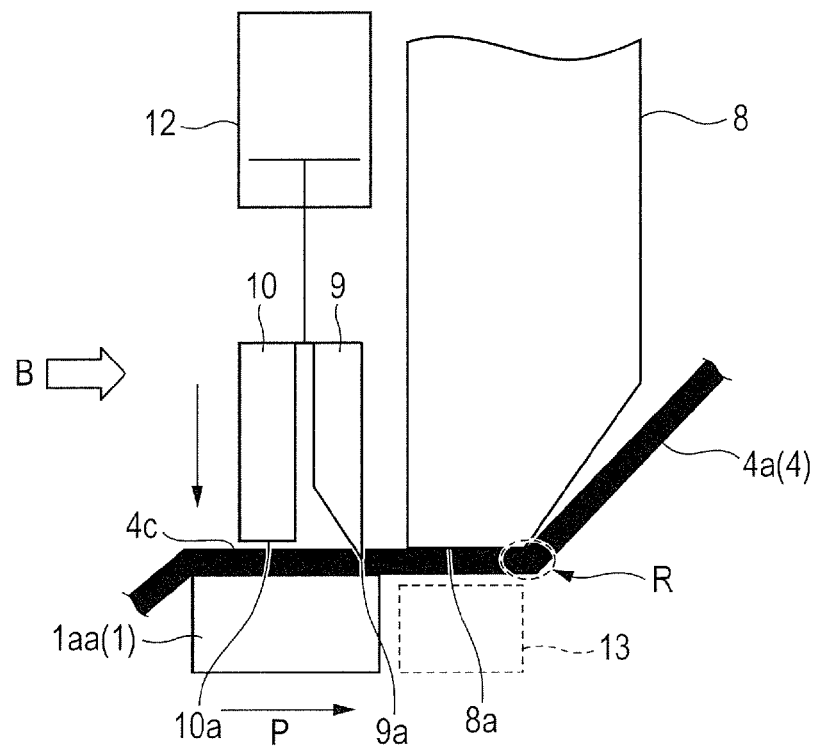
FIG. 21 is a schematic diagram illustrating one example of the tool operation when wedge bonding is performed in the wire boding process in the assembling of the semiconductor device illustrated in FIG. 1.
Figure 22:
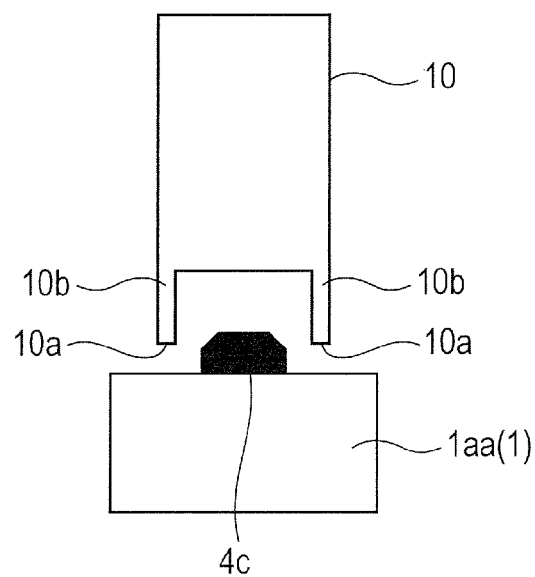
FIG. 22 is a schematic diagram illustrating one example of a structure viewed from a direction indicated by an arrow B in FIG. 21.
Figure 23:
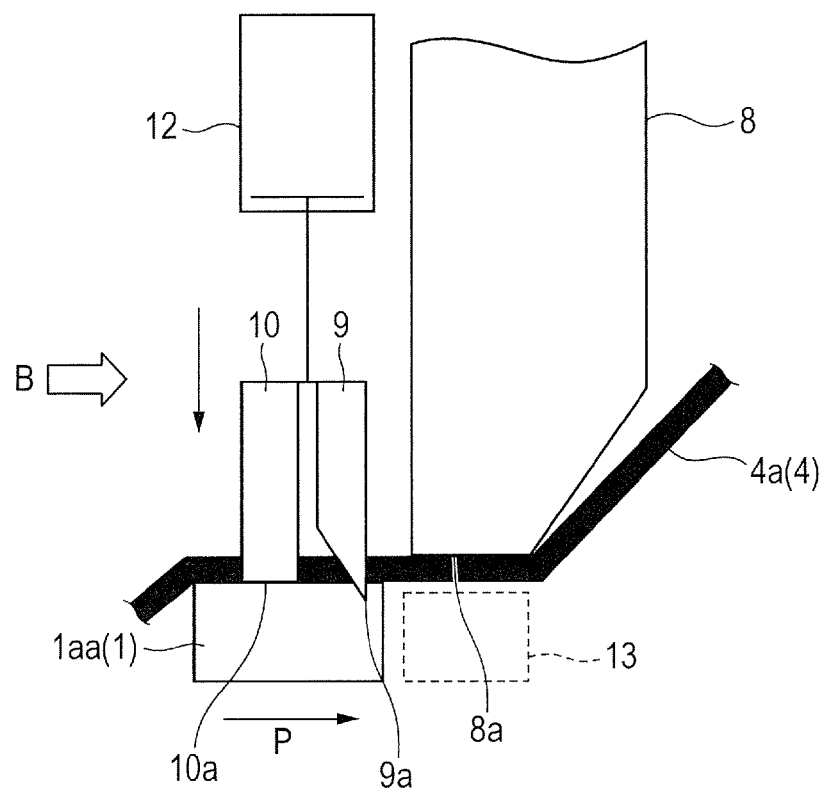
FIG. 23 is a schematic diagram illustrating one example of the tool operation when wedge bonding is performed in the wire boding process in assembling of the semiconductor device illustrated in FIG. 1.
Figure 24:
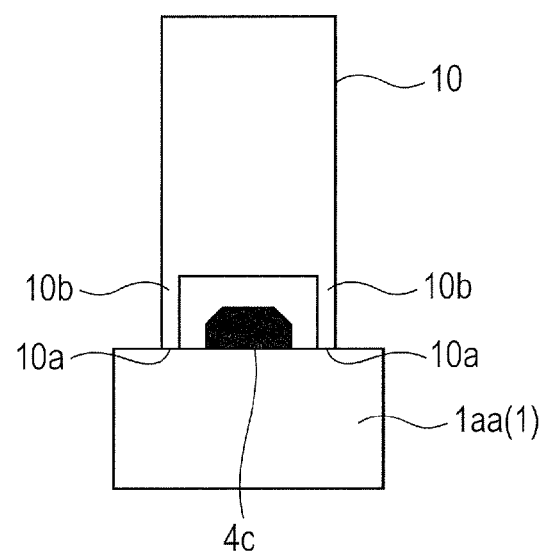
FIG. 24 is a schematic diagram illustrating one example of a structure viewed from the direction indicated by the arrow B in FIG. 23.
Figure 25:
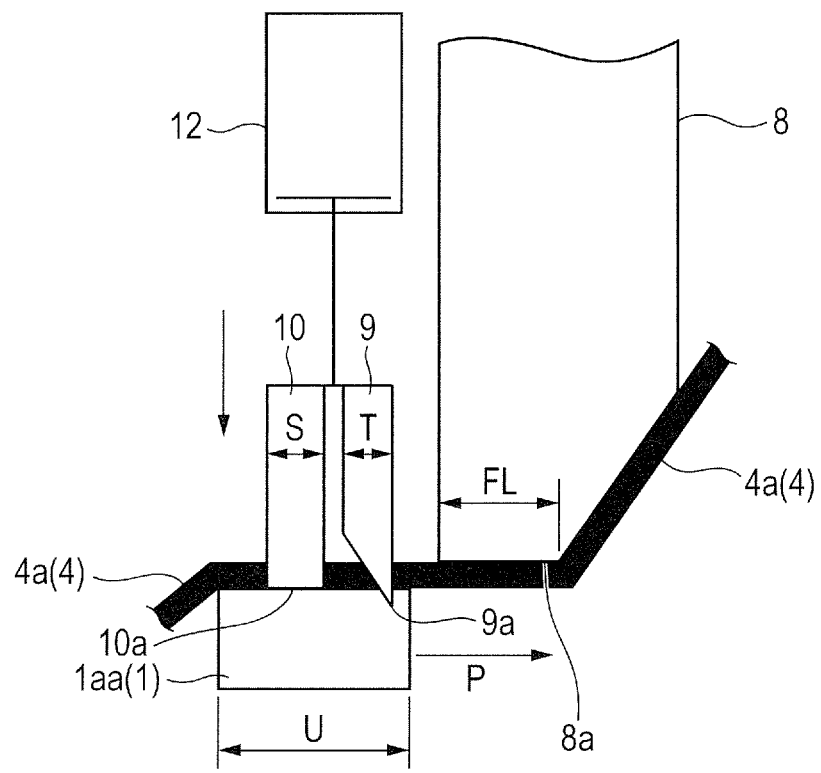
FIG. 25 is a schematic diagram illustrating one example of an advantageous effect obtained by wire cutting after wedge bonding has been performed in assembling of the semiconductor device illustrated in FIG. 1.

FIG. 19 is a schematic diagram illustrating one example of the tool operation when wedge bonding is performed in the wire bonding process in assembling of the semiconductor device illustrated in FIG. 1, FIG. 20 is a schematic diagram illustrating one example of the tool operation when the wedge bonding is performed in the wire boding process in assembling of the semiconductor device illustrated in FIG. 1 and FIG. 21 is a schematic diagram illustrating one example of the tool operation when the wedge bonding is performed in the wire boding process in assembling of the semiconductor device illustrated in FIG. 1. In addition, FIG. 22 is a schematic diagram illustrating one example of a structure viewed from a direction indicated by an arrow B in FIG. 21, FIG. 23 is a schematic diagram illustrating one example of the tool operation when wedge bonding is performed in the wire boding process in assembling of the semiconductor device illustrated in FIG. 1, FIG. 24 is a schematic diagram illustrating one example of a structure viewed from the direction indicated by the arrow B in FIG. 23 and FIG. 25 is a schematic diagram illustrating one example of an advantageous effect obtained by wire cutting after the wedge bonding has been performed in assembling of the semiconductor device illustrated in FIG. 1.

After the first bonding has been terminated, the wedge 8 is moved onto the wide-width part 1aa of the inner lead section 1a as illustrated in FIG. 19. Incidentally, since while the wedge 8 is being moved and when the wedge 8 has been arranged on the wide-width part 1aa of the inner lead section 1a, the lower end part (the edge) 9a of the cutter 9 and the lower end part (the lower surface) 10a of the stopper 10 are arranged at the positions higher than the lower end part (the lower surface) 8a of the wedge 8, it is possible to prevent the cutter 9 and the stopper 10 from coming into contact with the Al wire 4a.

Consequently, it is possible to reduce the possibility that the Al wire 4a may be damaged and if is possible to improve the reliability of the power device 5.

After the wedge 8 has been moved onto the wide-width part 1aa of the inner lead section 1a, the wedge 8 is lowered by being driven by the first actuator 11 illustrated in FIG. 10 and the Al wire 4a is pressed against the wide-width part 1aa by the wedge 8 so as to couple the Al wire 4a with the wide-width part 1aa of the inner lead section 1a as illustrated in FIG. 20. Incidentally, in the wedge bonding according to the present embodiment, bonding is performed by applying, for example, ultrasonic waves and a load.

Incidentally, since still while the bonding is being performed, the lower end part (the edge) 9a of the cutter 9 and the lower end part (the lower surface) 10a of the stopper 10 are arranged at the positions higher than the lower end part (the lower surface) 8a of the wedge 8, it is possible to prevent the cutter 9 and the stopper 10 from coming into contact with the Al wire 4a while the bonding is being performed and thereby it is possible to reduce the possibility that the Al wire 4a may be damaged and it is possible to improve the reliability of the power device 5.

As illustrated in FIG. 21, by performing the wedge bonding according to the present embodiment, a coupling part 4c of the Al wire 4a is formed on the wide-width part 1aa and the Al wire is coupled to the wide-width part 1aa of the inner lead section 1a along the coupling part 4c.

After the Al wire 4a has been coupled to the wide-width part 1aa of the inner lead section 1a, the wedge 8, line cutter 9 and the stopper 10 are once slightly risen to such an extent that they are brought out of contact with the Al wire 4a and are further moved in the first direction P in a state of maintaining rising of the wedge 8, the cutter 9 and the stopper 10 so as to withdraw the wedge 8 from the top of the lead section 1. After the wedge 8 has been withdrawn, the wedge 8 is lowered by being driven by the first actuator 11 illustrated in FIG. 10 and movement of the wedge 8 is stopped at a position where the wedge 8 is in slight contact with the Al wire 4a. Then, the cutter 9 is lowered together with the stopper 10 by the second actuator 12 and cutting of the Al wire 4a is started by the cutter 9 as illustrated in FIG. 21.

The wedge 8 is kept in contact with the Al wire 4a (the wedge 8 is pressed against the Al wire 4a by exerting a slight load onto the wedge 8) still while the Al wire 4a is being cut. Incidentally, as illustrated in FIG. 22, bifurcated leg parts 10b are provided on an end part of the stopper 10 which includes the lower end parts 10a and owing to provision of the bifurcated leg parts 10b, the stopper 10 is formed so as not to come into contact with the coupling part 4c of the Al wire 4a still while the Al wire 4a is being cut.

The cutter 9 and the stopper 10 are lowered until the lower end part 10a of each leg part 10b of the stopper 10 strikes against the wide-width part 1aa of the lead section 1 in this state. Then, lowering of the cutter 9 is stopped at a point in time that the stopper 10 has struck against the wide-width part 1aa of the lead section 1 as illustrated an FIG. 23 and FIG. 24 and thereby cutting of the Al wire 4a is terminated.

Incidentally, as illustrated in FIG. 23, since the lower end part (the edge) 9a of the cutter 9 projects downward slightly beyond the lower end part 10a of the stopper 10, the lower end part (the edge) 9a of the cutter 9 strikes against the wide-width part 1aa of the inner lead section 1a slightly earlier than striking of the lower end part 10a of the stopper 10 against the wide-width part 1aa or the lead section 1.

Thereby, the lower end part (the edge) 9a of the cutter 9 slightly cuts (bites) into the wide-width part 1aa and a small cut (a cutter scar) is formed in the wide-width part 1aa by the lower end part (the edge) 9a of the cutter 9. That is, it is possible to surely cut the Al wire 4a by lowering the cutter 9 until the lower end part (the edge) 9a of the cutter 9 surely cuts into the wide-width part 1aa and therefore it is possible to prevent the Al wire 4a from being left partially uncut.

Further, it is possible for an operator to prevent generation of an uncut part of the Al wire 4a by confirming that the small cut (the cutter scar) is formed in the wide-width part 1aa by the lower end part (the edge) 9a of the cutter 9.

In addition, as illustrated in FIG. 24, the end part of the stopper 10 including the lower end part 10a is formed as the leg parts 10b which are arranged on the both sides of the Al wire 4a so as to stride over the coupling part 4c of the Al wire 4a. In other words, the leg parts 10b which are arranged on the both sides so as to stride over the coupling part 4c of the Al wire 4a are provided on the end part of the stopper 10 and leading ends of the two leg parts 10b are formed as the lower end parts 10a of the stopper 10.

Thereby, It is possible to strike the stopper 10 against the wide-width part 1aa such that the stopper 10 strides over the coupling part 4c along which the Al wire 4a is coupled with the wide-width part 1aa by the bifurcated leg parts 10b.

Consequently, when the lower end part 10a of the stopper 10 has struck against the wide-width part 1aa of the lead section 1, it is possible to prevent the stopper 10 from coming into contact with the coupling part 4c of the Al wire 4a and thereby it is possible to prevent the coupling part 4c from being damaged.

In addition, as illustrated in FIG. 23, when wire cutting performed by the cutter 9, the wedge 8 withdraws from the lead section 1 (the wide-width part 1aa of the inner lead section, 1a) in the first direction P and is put on standby and a space part 13 is formed directly under the wedge 8 in this state. Then, as illustrated in FIG. 21, when wire cutting is performed by the cutter 9, it is preferable that the lower end part 8a of the wedge 8 be in contact with the Al wire 4a. That is, when wire cutting is performed, it is preferable that wire cutting be performed in a state where the wedge 8 lightly pushes the Al wire 4a, that is, the wedge 8 keeps pushing the Al wire 4a with a small load.

Thereby, as illustrated by a part R in FIG. 21, it is possible to form a habit modeling on the shape of the lower end part 8a of the wedge 8 on the Al wire 4a. Thereby, as illustrated in FIG. 18, when the wedge 8 has risen so as to shift to the next processing, it is possible to shift to the next processing in a state of leaving the Al wire 4a in contact with the wedge 8.

Consequently, when performing the first bonding in the next processing, it is possible to prevent occurrence of blank shooting (the Al wire 4a is detached from the lower end part 8a of the wedge 8 and the wire bonding operation is performed in the absence of the Al wire 4a).

After completion of wire coupling to the lead section 1, first, the cutter 9 and the stopper 10 rise simultaneously and go out of contact with and withdraw from the lead section 1, then the wedge 8 rises late and thereby the wedge 8, the cutter 9, the stopper 10 and the Al wire 4a withdraw upwards from the lead section 1 as illustrated in FIG. 18.

Thereafter, wire boding is performed on the desired electrode pads 2c and 2d so as to be bonded to the lead sections 1 which correspond to these electrode pads 2c and 2d by the same wedge bonding method as the above and thereby the wire bonding process Is completed.

4. Resin Sealing

Figure 26:
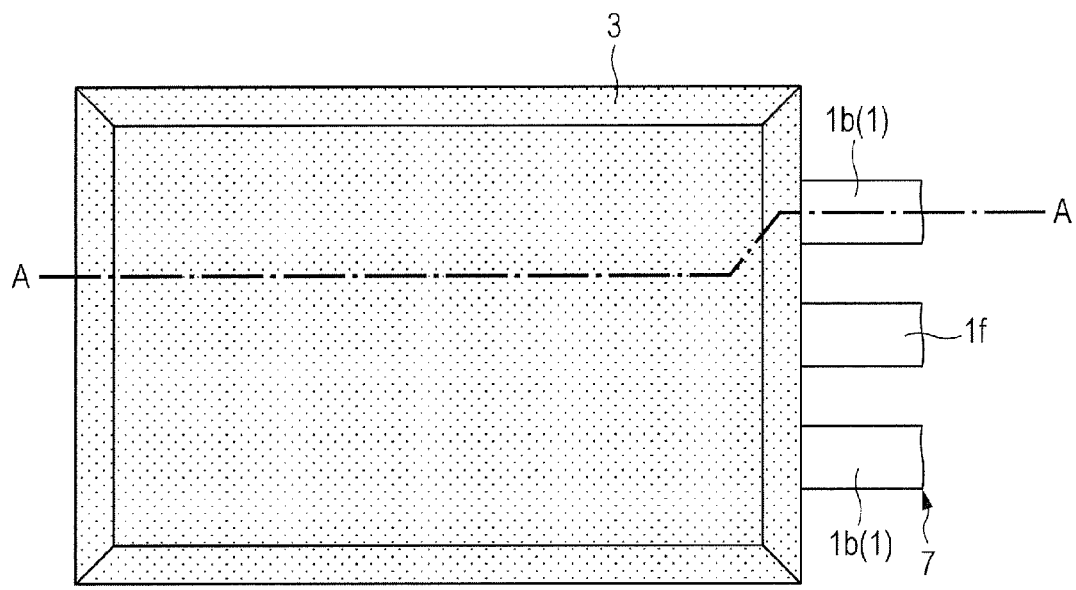
FIG. 26 is a partial plan view illustrating one example of a structure obtained after resin sealing has been performed in assembling of the semiconductor device illustrated in FIG. 1.
Figure 27:
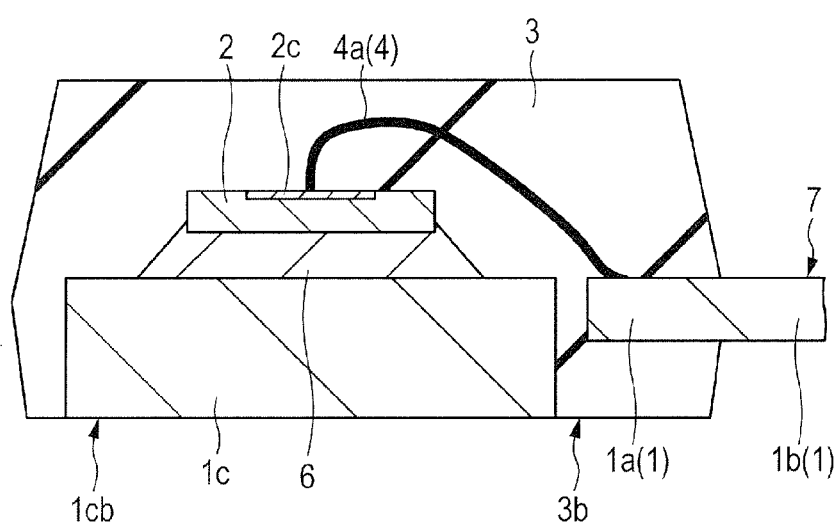
FIG. 27 is a partial sectional diagram illustrating one example of the structure taken along the A-A line in FIG. 26.

FIG. 26 is a partial plan view illustrating one example of a structure obtained after resin sealing has been performed in assembling of the semiconductor device illustrated in FIG. 1 and FIG. 27 is a partial sectional diagram illustrating one example of the structure taken along the A-A line in FIG. 26.

After the wire bonding has been performed, the resin sealing is performed as illustrated in FIG. 26 and FIG. 27. Here, as illustrated in FIG. 27, the sealing element 3 is formed with sealing resin and parts of the semiconductor chip 2, the solder material 6, the Al wire 4a, the inner lead section 1a and the chip mounting section 1c are sealed with the sealing element 3. At this time, the resin sealing is performed such that the lower surface 1cb of the chip mounting section 1c is exposed to the lower surface 3b of the sealing element 3.

Incidentally, the sealing resin is, for example, thermosetting epoxy resin and so forth.

5. Plating Formation

After the resin sealing has been performed, plating formation is performed.

In a plating formation process, plated films formed by solder plating and so forth are formed on the surfaces of the plurality of outer lead sections 1b and the lower surface 1cb of the chip mounting section 1c.

6. Marking

After the plating formation has been performed, marking is performed.

In a marking process, desired marks (seals) are formed, for example, on the surface of the sealing element 3. The marks are, for example, a kind, a model number and so forth of a product and the marks are formed by performing laser irradiation and so forth.

7. Lead Cutting (Dicing)

Figure 28:
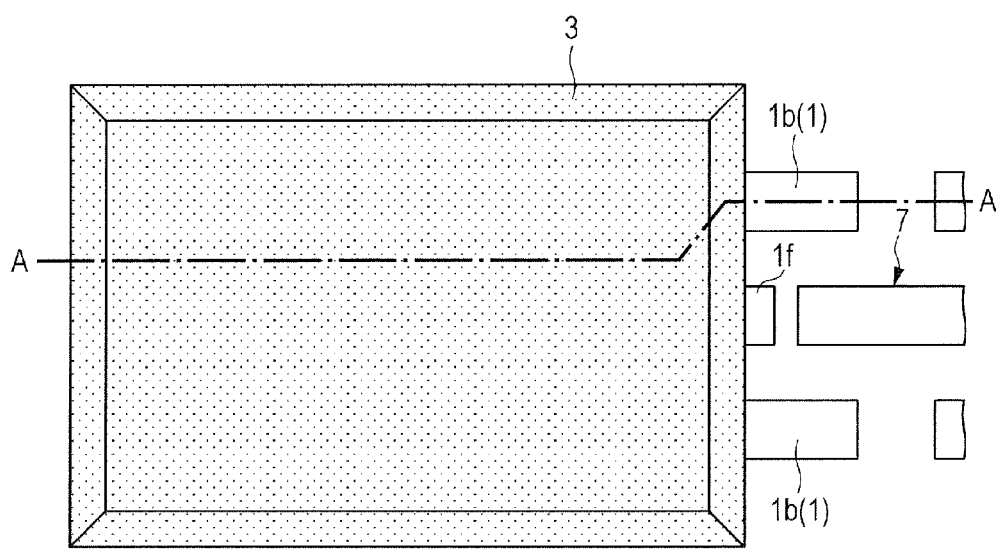
FIG. 28 is a partial plan view illustrating one example of a structure obtained after cutting and shaping have been performed in assembling of the semiconductor device illustrated in FIG. 1.
Figure 29:
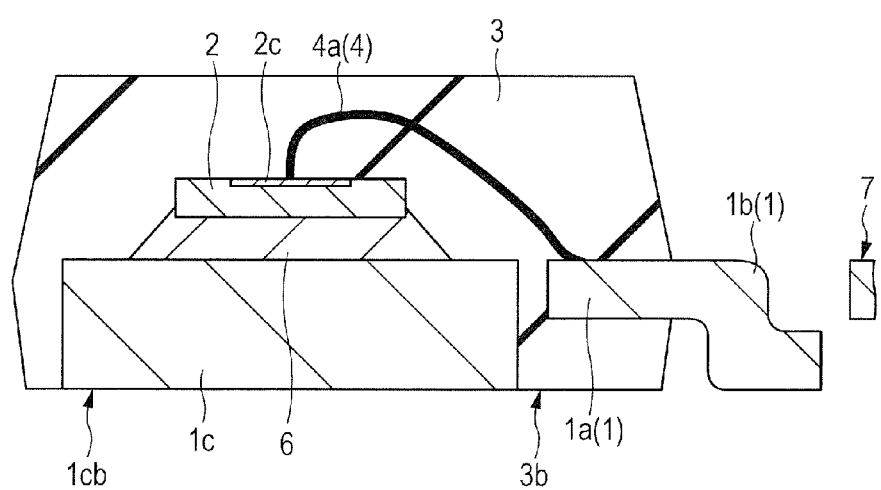
FIG. 29 is a partial sectional diagram illustrating one example of the structure taken along the A-A line in FIG. 28.

FIG. 28 is a partial plan view illustrating one example of a structure obtained after cutting and shaping have been performed in assembling of the semiconductor device illustrated in FIG. 1 and FIG. 29 is a partial sectional diagram illustrating one example of the structure taken along the A-A line in FIG. 28.

After the marking has been performed, Lead machining is performed.

In a lead cutting process according to the present embodiment, the respective outer lead sections 1b and the hanging lead 1f illustrated in FIG. 2 are cut apart from the frame section 7b of the lead frame 7 illustrated in FIG. 5 and further, as illustrated in FIG. 3, each outer lead section 1b is bent into a desired shape (here, for example, the gull wing shape).

From the foregoing, assembling of the power device 5 is completed.

According to the semiconductor device manufacturing method of the present embodiment, when cutting the Al wire 4a after the wire coupling has been performed by the wedge 8, the cutter 9 is lowered and the Al wire 4a is cut by the cutter 9 in a state of leaving the wedge 8 withdrawn from the top of the lead section 1 (the wide-width part 1aa of the inner lead section 1a) backward (in the first direction P) as illustrated in FIG. 21. At this time, also lowering of the cutter 9 is stopped at a point in time that the stopper 10 which lowers together with the cutter 9 has struck against the lead section 1 and also cutting of the Al wire 4a by the cutter 9 is completed thereupon.

That is, according to the present embodiment, since cutting of the Al wire 4a which has beers subjected to the wedge bonding is performed in the state of leaving the wedge 8 withdrawn from the top of the lead section 1, it becomes unnecessary to ensure the space for seating the wedge 8 on the lead section 1.

Accordingly, it is possible to reduce the length in the first direction P of the lead section 1, in particular, the wide-width part 1aa of the inner lead section 1a. Thereby, it is possible to promote miniaturization of the power device 5 by reducing the outer size of the power device 5 illustrated in FIG. 1.

As a result of examinations on miniaturization of the power device 5, the inventors and others of the present patent application have found that when it is intended to reduce the length in the first direction P of the wide-width part 1aa of the inner lead section 1a, it becomes difficult to cut the wire by determining the stop position of the cutter 9 by the wedge 8. That is, the inventors and others have found that when it is intended to reduce the length in the first direction P of the wide-width part 1aa of the inner lead section 1a for miniaturization of the power device 5, it is difficult to perform wire cutting because no sufficient seating space on the lead section 1 is ensured for the wedge 8.

It is conceivable to reduce the length along which the wedge 8 presses the lead section 1. However, in this case, the area of the coupling part 4c of the wire with the lead section 1 is reduced and it leads to an increase in ON resistance.

Accordingly, the inventors and others of the present patent application have conceived of such a technical idea that the stop position of the cutter 9 when the cutter 9 is lowered is determined by a tool (the stopper 10) which is different from the wedge 8. That is, since cutting of the Al wire 4a which has been subjected to the wedge bonding is performed in the state of leaving the wedge 8 withdrawn from the top of the lead section 1, it becomes unnecessary to ensure the space for seating the wedge 8 on the lead section 1 and consequently it is possible to promote miniaturization of the power device 5 by reducing the length in the first direction P of the lead section 1.

In addition, since it is possible to reduce the length in the first direction P of the lead section 1, it becomes possible to increase the sizes of each chip mounting section 1a and each chip and thereby it is possible to improve characteristics of the power device 5.

Incidentally, according to the present embodiment, as illustrated in FIG. 24, since the stopper 10 strikes against the lead section 1 such that the leg parts 10b thereof stride over the coupling part 4c of the Al wire 4a on the lead section 1, consideration is taken so as not to damage the Al wire 4a.

In addition, as illustrated in FIG. 21, in the first direction P that the wedge 8 goes away from the semiconductor chip 2 illustrated in FIG. 2, the stopper 10 is arranged so as to sandwich the cutter 9 together with the wedge 8. That is, in the first direction P, the cutter 9 is arranged between the wedge 8 and the stopper 10.

Thereby, it is possible to keep the length in the first direction P of the lead section 1 within a range of a total width in the first direction P of the cutter 9 and the stopper 10. Further, since the leg parts 10b of the stopper 10 are formed so as to stride over the coupling part 4c of the Al wire 4a, it is possible to arrange the stopper 10 above the coupling part 4c.

Consequently, as illustrated in FIG. 25, it is possible to reduce a length U in the first direction P of the lead section 1 to such an extent that the length U becomes slightly longer than a tool length FL in the first direction P of the wedge 8.

Here, examples of the lengths of the respective members will be given as follows. For example, the tool length FL in the first direction P of the wedge 8 is about 0.5 mm, a width T in the first direction P of the cutter 9 is about 0.1 mm to about 0.2 mm, a width S in the first direction P of the stopper 10 is about 0.3 mm to about 0.4 mm and the length U in the first direction P of the lead section 1 is about 0.55 mm to about 0.6 mm.

In the foregoing, the invention which has been made by the inventors and others of the present invention has been specifically described on the basis of the preferred embodiments. However, it goes without saying that the present invention is not limited to the above-mentioned embodiments and may be altered and modified in a variety of ways within the scope not deviating from the gist of the present invention.

For example, although in the above-mentioned embodiment, a case where the actuator is adopted as the drive section for vertically moving the wedge 8, the cutter 9 and the stopper 10 has been described, an air cylinder and so forth may be adopted as the drive section for vertically moving the wedge 8, the cutter 9, the stopper 10 and so forth.

What is claimed is:

1. A semiconductor device manufacturing method, comprising the steps of:
   (a) preparing a lead frame which includes a chip mounting section and a plurality of lead sections arranged around the chip mounting section;
   (b) after the step (a), mounting a semiconductor chip which includes a plurality of electrode pads on the chip mounting section of the lead frame; and
   (c) after the step (b), electrically coupling together the electrode pads of the semiconductor chip and the lead sections individually by a plurality of Al wires,
   wherein the step (c) includes the steps of
   (c1) electrically coupling together each electrode pad of the semiconductor chip and each Al wire by a wedge as a bonding tool,
   (c2) after the step (c1), pressing the Al wire against the lead section by the wedge and thereby electrically coupling together the Al wire and the lead section, and
   (c3) after the step (c2), lowering a cutter member and cutting the Al wire by the cutter member in a state of leaving the wedge withdrawn from the top of the lead section and terminating cutting of the Al wire by the cutter member at a point in time that a stopper member which is lowered in accordance with lowering of the cutter member has struck against the lead section.

2. The semiconductor device manufacturing method according to claim 1,
   wherein the stopper member is arranged so as to sandwich the cutter member together with the wedge in a first direction that the wedge goes away from the semiconductor chip.

3. The semiconductor device manufacturing method according to claim 2, wherein in the step (c3), the stopper member is made to strike against the lead section such that the stopper member strides over a coupling part of the Al wire along which the Al wire is coupled with the lead section.

4. The semiconductor device manufacturing method according to claim 3,
wherein in the step (c2), a lower end part of the stopper member is arranged at a position higher than a lower end part of the wedge.

5. The semiconductor device manufacturing method according to claim 4,
wherein a lower end part of the cutter member projects downwards beyond the lower end part of the stopper member.

6. The semiconductor device manufacturing method according to claim 5,
wherein in the step (c3), when cutting the Al wire by the cutter member, a space part is formed directly under the wedge.

7. The semiconductor device manufacturing method according to claim 6,
wherein the cutter member and the stopper member are attached so as to move integrally with each other.

8. The semiconductor device manufacturing method according to claim 7,
wherein a length in the first direction of the lower end part of the stopper member is shorter than a length in the first direction of the lower end part of the wedge.

9. A semiconductor device manufacturing method, comprising the steps of:
(a) preparing a lead frame which includes a chip mounting section and a plurality of lead sections arranged around the chip mounting section;
(b) after the step (a), mounting a semiconductor chip which includes a plurality of electrode pads on the chip mounting section of the lead frame; and
(c) after the step (b), electrically coupling together the electrode pads of the semiconductor chip and the lead sections individually by a plurality of Al wires,
wherein the step (c) includes the steps of
(c1) electrically coupling together each electrode pad of the semiconductor chip and each Al wire by a wedge as a bonding tool,
(c2) after the step (c1), pressing the Al wire against the lead section by the wedge and thereby electrically coupling together the Al wire and the lead section, and
(c3) after the step (c2), lowering a cutter member which is attached to a drive section which is the same as that for the wedge and cutting the Al wire by the cutter member in a state of leaving the wedge withdrawn from the top of the lead section and terminating cutting of the Al wire by the cutter member at a point in time that a stopper member which is lowered in accordance with lowering of the cutter member has struck against the lead section.

10. The semiconductor device manufacturing method according to claim 9,
wherein the stopper member is attached to the same drive section as that for the wedge and the cutter member.

11. The semiconductor device manufacturing method according to claim 9,
wherein the stopper member is arranged so as to sandwich the cutter member together with the wedge in a first direction that the wedge goes away from the semiconductor chip.

12. The semiconductor device manufacturing method according to claim 11,
wherein in the step (c3), the stopper member is made to strike against the lead section such that the stopper member strides over a coupling part of the Al wire along which the Al wire is coupled with the lead section.

13. The semiconductor device manufacturing method according to claim 12,
wherein in the step (c2), a lower end part of the stopper member is arranged at a position higher than a lower end part of the wedge.

14. The semiconductor device manufacturing method according to claim 13,
wherein a lower end part of the cutter member projects downwards beyond the lower end part of the stopper member.

15. The semiconductor device manufacturing method according to claim 14,
wherein in the step (c3), when cutting the Al wire by the cutter member, a space part is formed directly under the wedge.

* * * * *